(12) United States Patent
Zhang

(10) Patent No.: US 7,326,061 B2
(45) Date of Patent: Feb. 5, 2008

(54) VIA PROVIDING MULTIPLE ELECTRICALLY CONDUCTIVE PATHS

(75) Inventor: Tonglong Zhang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/638,407

(22) Filed: Dec. 14, 2006

(65) Prior Publication Data

US 2007/0093082 A1    Apr. 26, 2007

Related U.S. Application Data

(63) Continuation of application No. 11/400,217, filed on Apr. 10, 2006, now Pat. No. 7,168,957, which is a continuation of application No. 11/039,964, filed on Jan. 24, 2005, now Pat. No. 7,094,060, which is a continuation of application No. 10/317,143, filed on Dec. 12, 2002, now Pat. No. 6,848,912.

(51) Int. Cl.
*H01R 12/00* (2006.01)

(52) U.S. Cl. .................................... 439/55
(58) Field of Classification Search ............ 439/55, 439/71, 509; 174/259–262
See application file for complete search history.

(56) References Cited

U.S. PATENT DOCUMENTS

| | | |
|---|---|---|
| 5,610,433 A | 3/1997 | Merrill et al. |
| 6,613,986 B1 | 9/2003 | Hirose et al. |
| 6,651,322 B1 | 11/2003 | Currie |
| 6,667,443 B2 | 12/2003 | Kondo et al. |
| 6,690,621 B2 | 2/2004 | Porzio |
| 6,879,234 B2 | 4/2005 | Furumiya et al. |
| 7,094,060 B2 * | 8/2006 | Zhang ................... 439/55 |
| 2003/0102151 A1 | 6/2003 | Hirose et al. |

OTHER PUBLICATIONS

Geoff Smithson, "Practical RF Printed Circuit Board Design," presented at the Institution of Electrical Engineers (IEE) Training Event "How to Circuits," (location unknown) Apr. 5, 2000, 6 pages.
IBM, Test Probe Contact Grid Translator Board, Jan. 1979, IBM Technical Disclose Bulletin, vol. 21, All.

* cited by examiner

*Primary Examiner*—J. F. Duverne
(74) *Attorney, Agent, or Firm*—Sterne, Kessler, Goldstein & Fox PLLC

(57) ABSTRACT

A via provides a plurality of electrical connections between conductors on different layers of a circuit board. The via includes an opening through the circuit board formed by a plurality of substantially partially overlapping bores. An electrically conductive plating is formed on an inner surface of the opening. The plating forms a plurality of distinct electrically conductive paths.

8 Claims, 23 Drawing Sheets

VIA PROVIDING MULTIPLE ELECTRICALLY CONDUCTIVE PATHS

CROSS-REFERENCE TO RELATED APPLICATION(S)

This application is a continuation of U.S. patent application Ser. No. 11/400,217 (now allowed), now U.S. Pat. No. 7,168,957 filed Apr. 10, 2006, which is a continuation of U.S. patent application Ser. No. 11/039,964 (now U.S. Patent No. 7,094,060), filed Jan. 24, 2005, which is a continuation of U.S. patent application Ser. No. 10/317,143 (now U.S. Pat. No. 6,848,912), filed Dec. 12, 2002, all of which are incorporated herein by reference in their entireties.

BACKGROUND OF THE INVENTION

1. Field of the Invention

The present invention relates to circuit boards and more particularly, to vias in multi-layer circuit boards.

2. Background Art

Vias in circuit boards allow an electrical connection to be formed between conductive layers. For multiple-electrical connections through a circuit board, multiple vias are used. The multiple vias must be implemented while complying with tight space requirements and maintaining low manufacturing costs. This becomes increasingly difficult as the size of circuit boards decreases, and as the number of electrical connections required by increasingly complex circuits increases.

What is needed is a method and apparatus that allows increased numbers of electrical signals to be routed through a circuit board while complying with the tight size restrictions of the circuit boards.

SUMMARY OF THE INVENTION

The present invention is directed to an apparatus and a method for providing a plurality of electrical connections between conductors on different layers of a circuit board.

In an aspect of the present invention, a via having multiple electrical connections is formed. The via includes an opening through the circuit board that is formed by a plurality of substantially partially overlapping bores. An electrically conductive plating is formed on an inner surface of the opening. Portions of the plating are removed to form a plurality of distinct electrically conductive paths.

In a further aspect, the plurality of distinct electrically conductive paths are formed by one or more additional bores formed in the circuit board, which remove plating from intersecting portions of the substantially partially overlapping bores.

In an aspect of the present invention, the plurality of substantially partially overlapping bores are bores that partially overlap each other. In another aspect, the plurality of substantially partially overlapping bores are bores that are closely adjacent to each other. In another aspect, the plurality of substantially partially overlapping bores are a combination of bores that partially overlap each other and bores that are closely adjacent.

The foregoing and other features and advantages of the invention will be apparent from the following more particular description of the embodiments of the invention, as illustrated in the accompanying drawings.

BRIEF DESCRIPTION OF THE DRAWINGS/FIGURES

The accompanying drawings which are incorporated therein and form a part of the specification illustrate the present invention and together with the description further serves to explain the principles of the invention and to enable a person skilled in the art to make and use the invention.

Figure 6A:
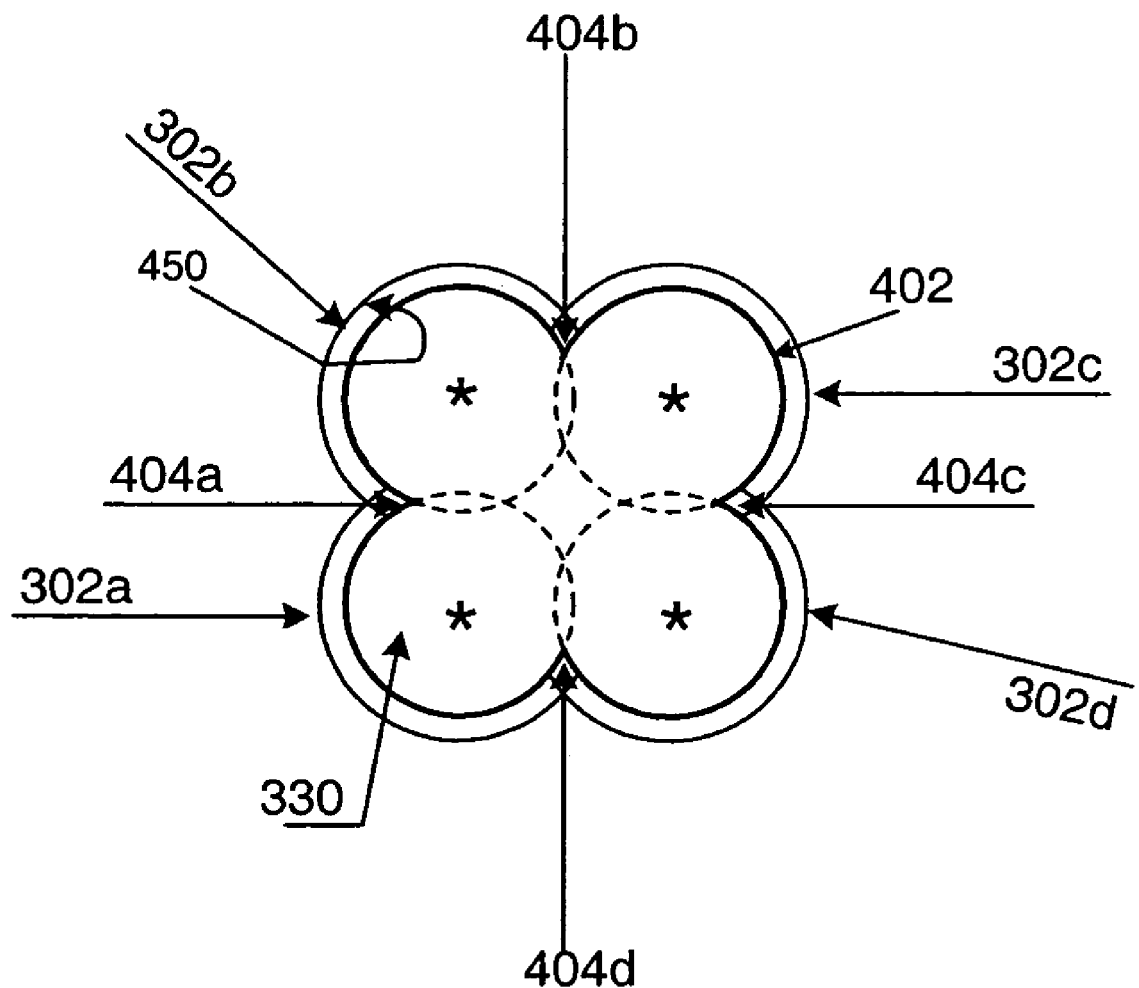
Figure 6B:
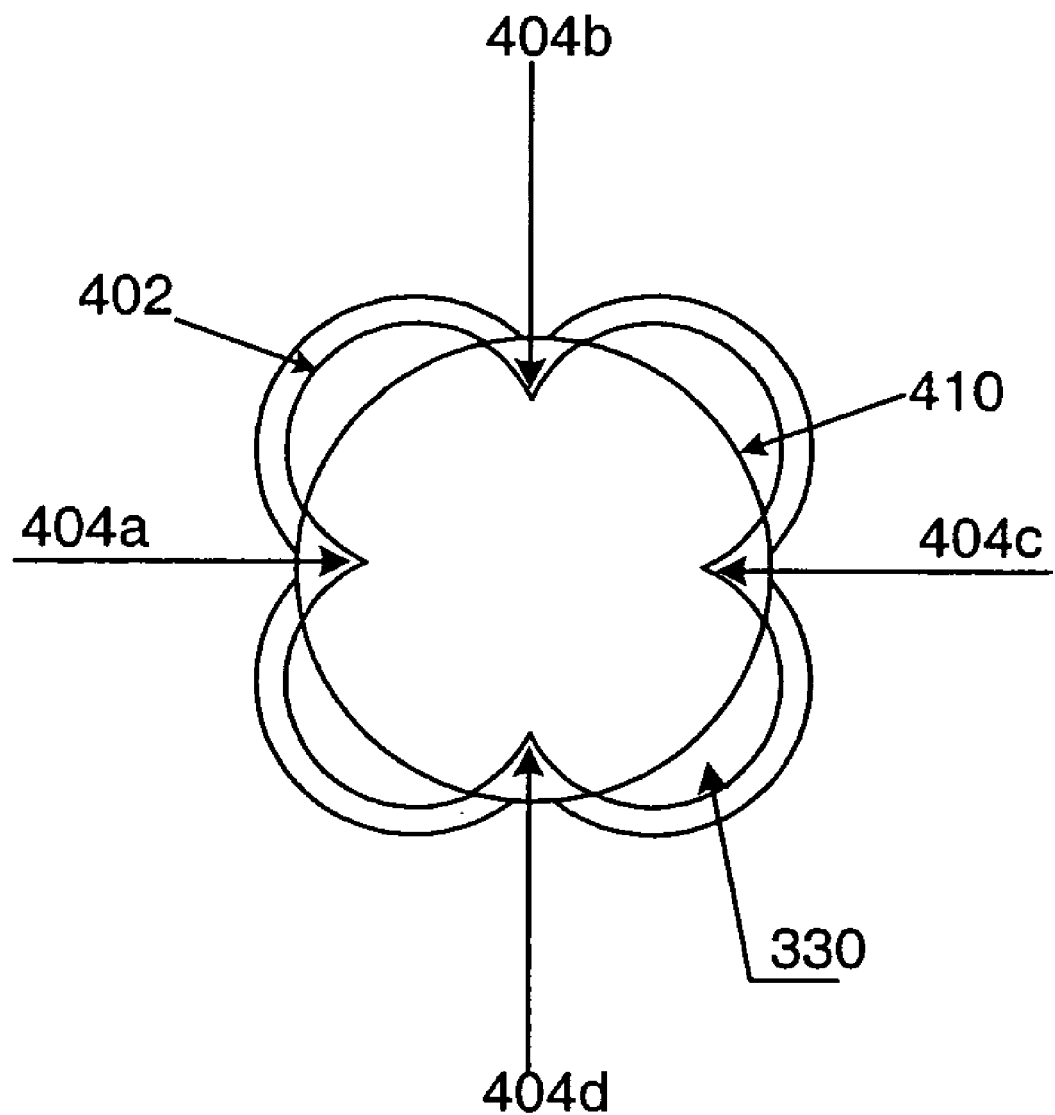
Figure 6C:
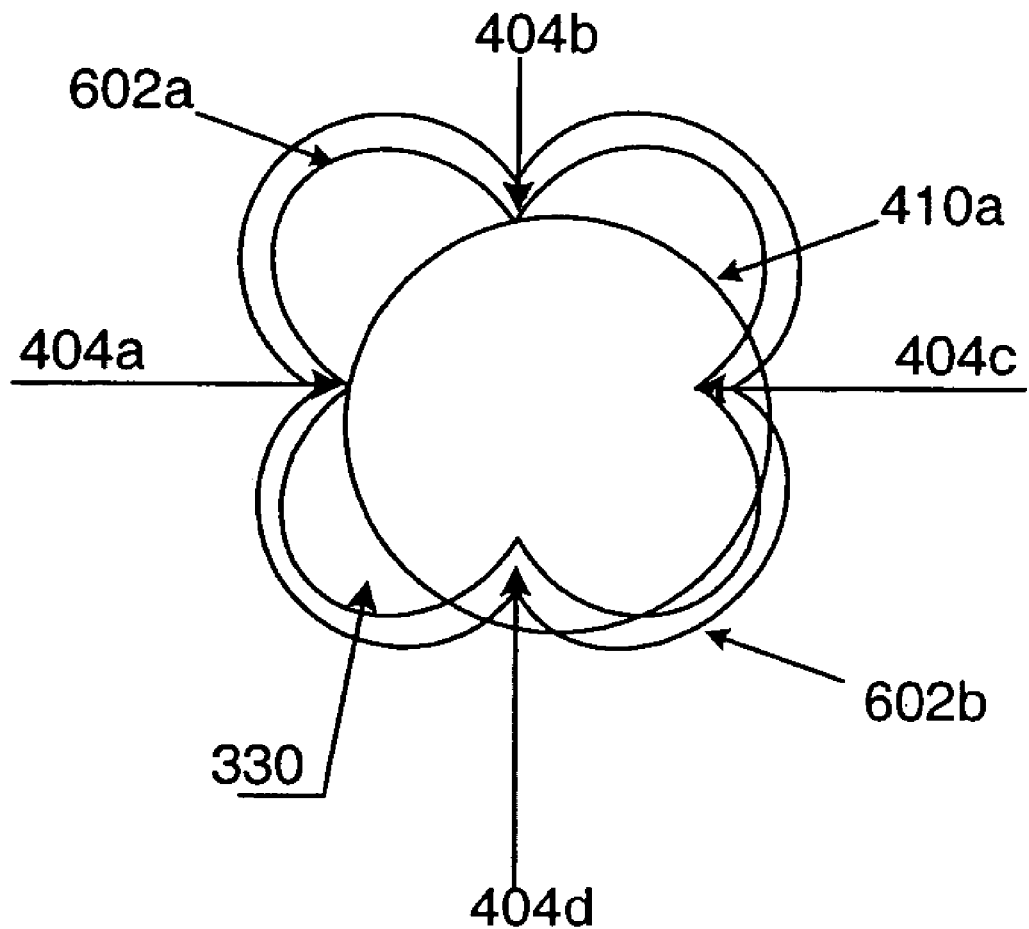
Figure 6D:
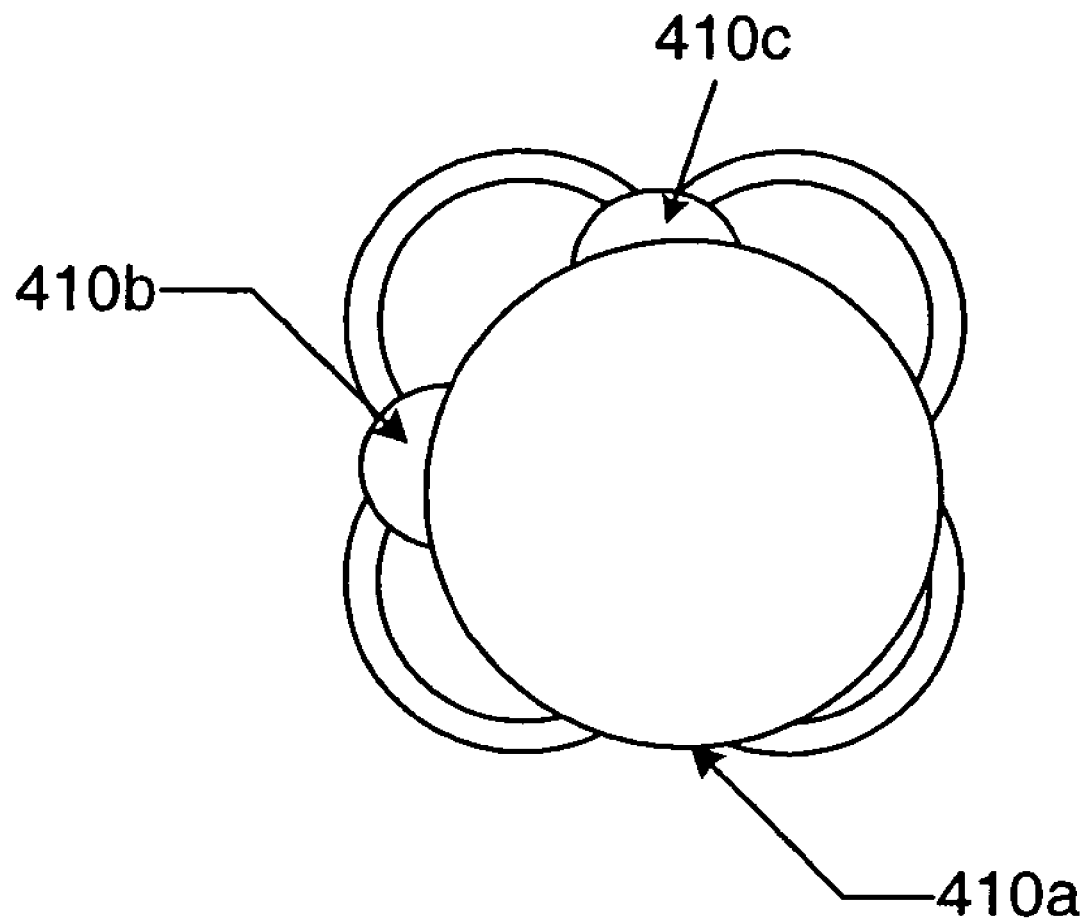
Figure 6E:
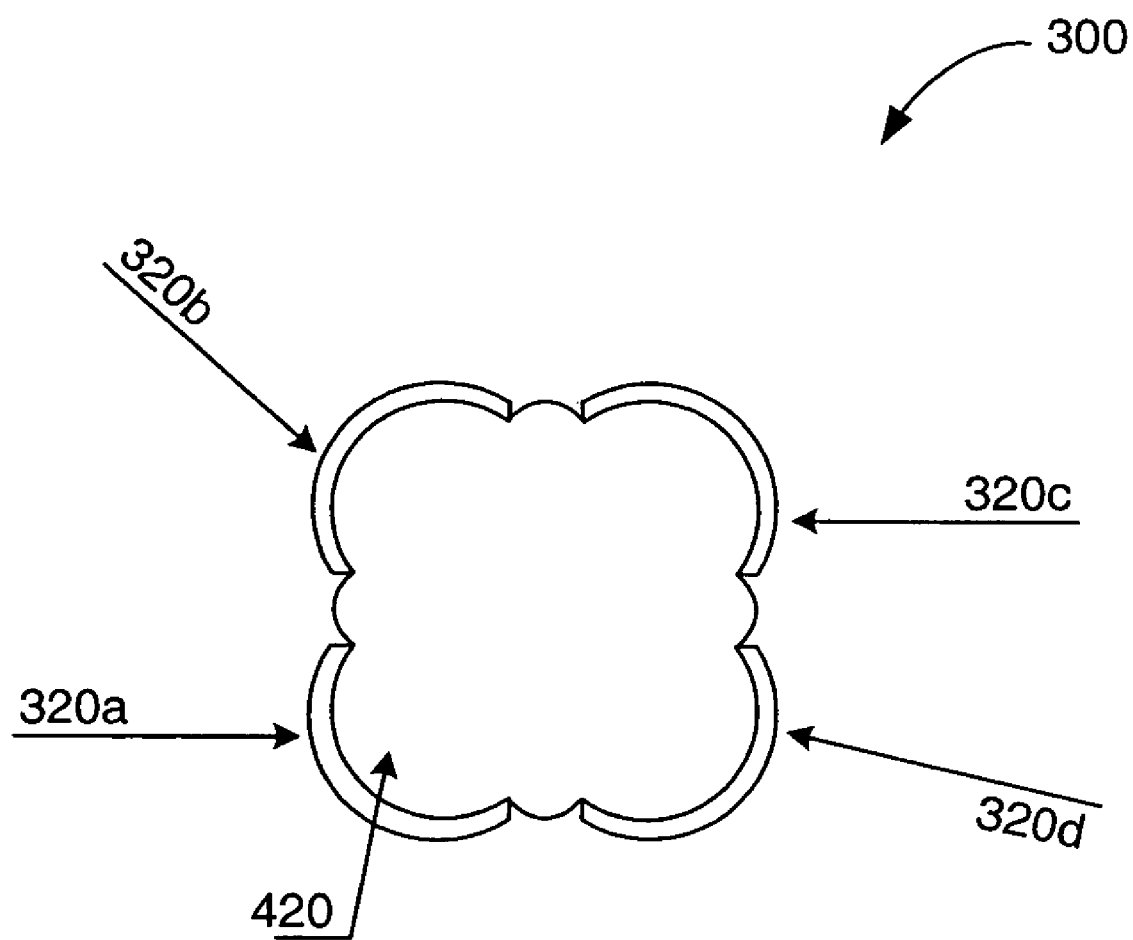

FIGS. 6A, 6B, and 6E show views of example process steps for forming a via having four electrically conductive paths, according to an example embodiment of the present invention.

FIG. 6C shows a view of an example process step for forming a via, where an additional bore is used to remove plating, according to an example embodiment of the present invention.

FIG. 6D shows a view of an example process step for forming a via, where a three additional bores are used to remove plating, according to an example embodiment of the present invention.

Figure 7:
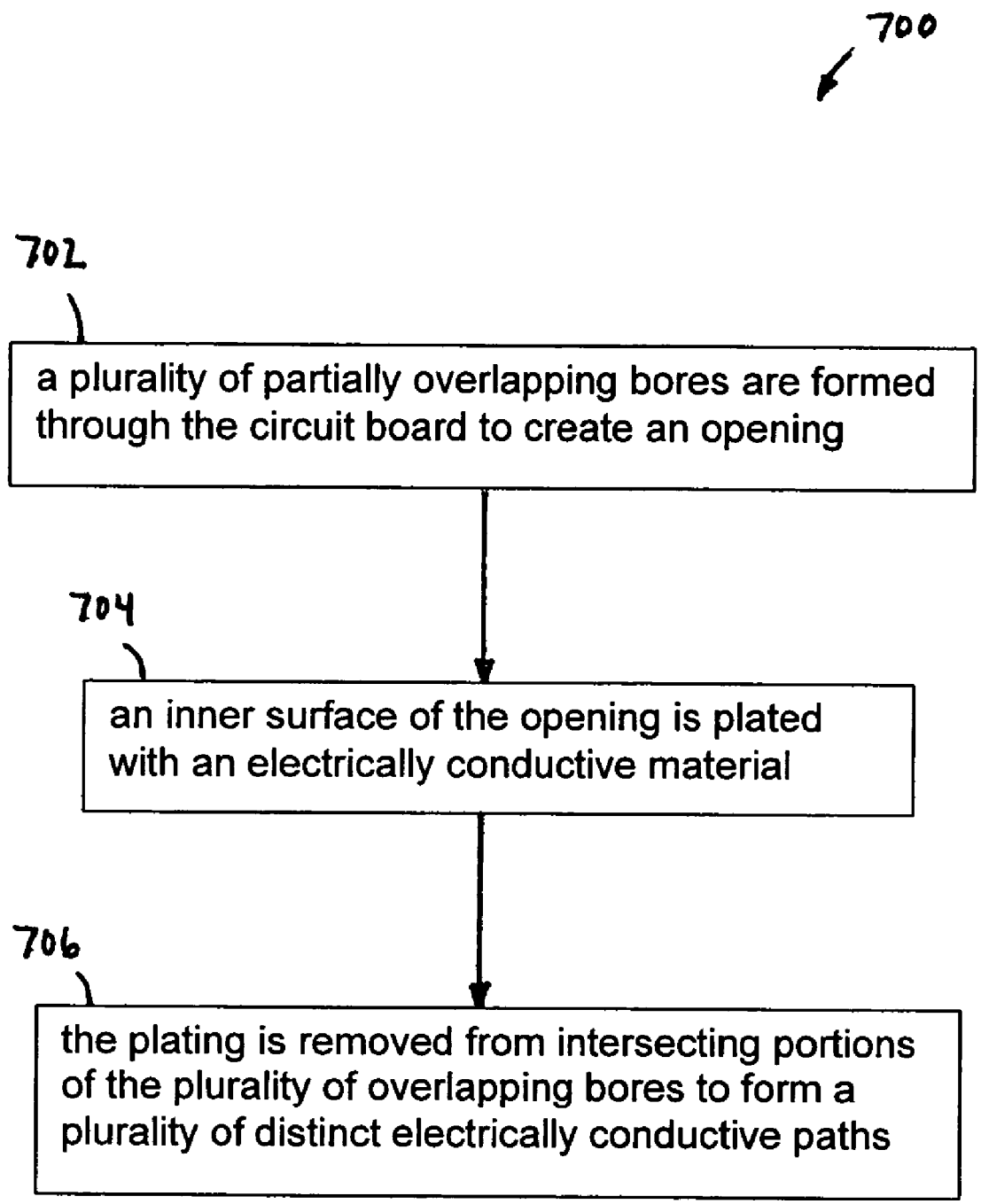

FIG. 7 illustrates a flowchart providing example steps for forming a plurality of electrically conductive paths between conductors on different layers of a circuit board using partially overlapping bores, according to an embodiment of the present invention.

Figure 8A:
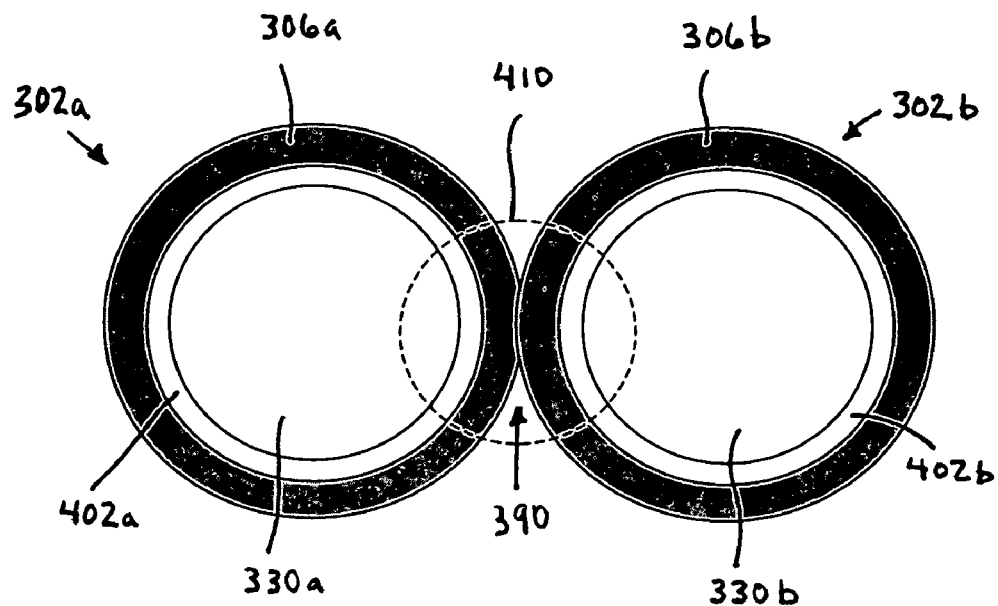
Figure 8B:
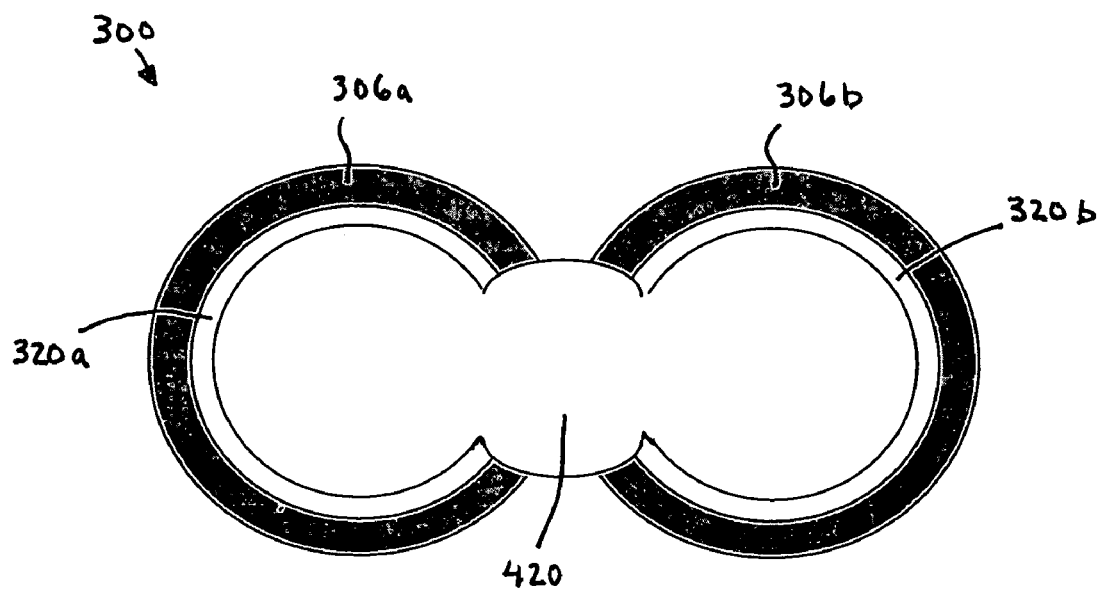

FIGS. 8A and 8B show views of example process steps for forming a via having a pair of electrically conductive paths, according to an example embodiment of the present invention.

Figure 8C:
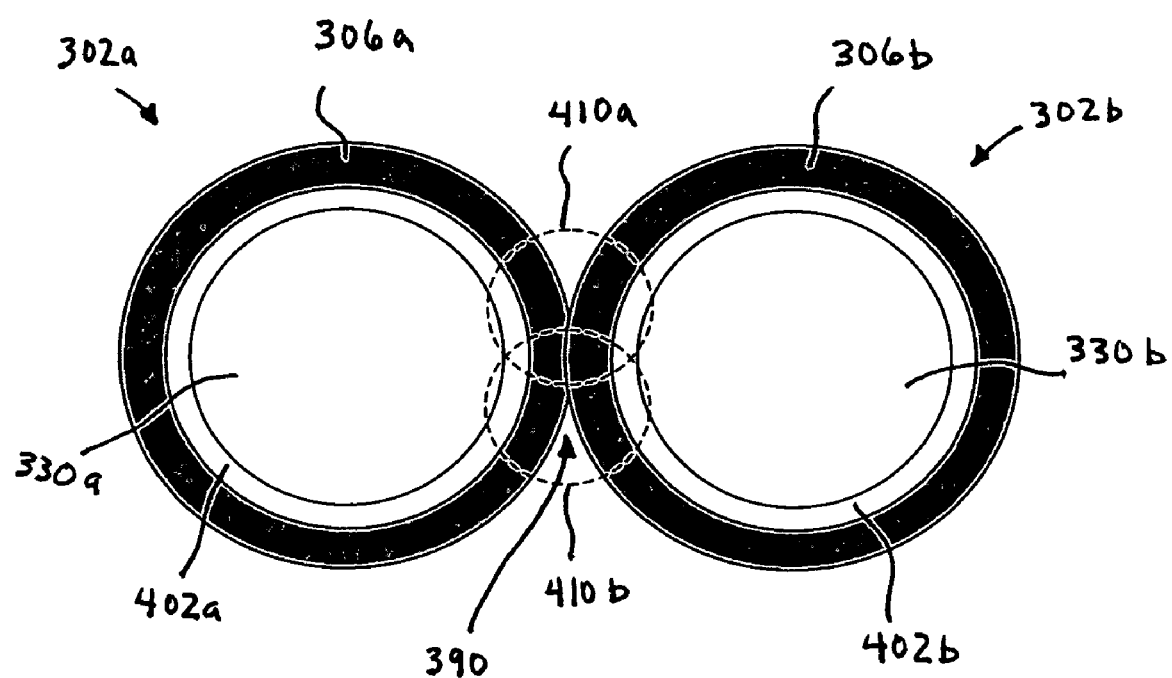

FIG. 8C illustrates an alternative embodiment of the present invention, where multiple additional bores are used to separate plating.

Figure 9:
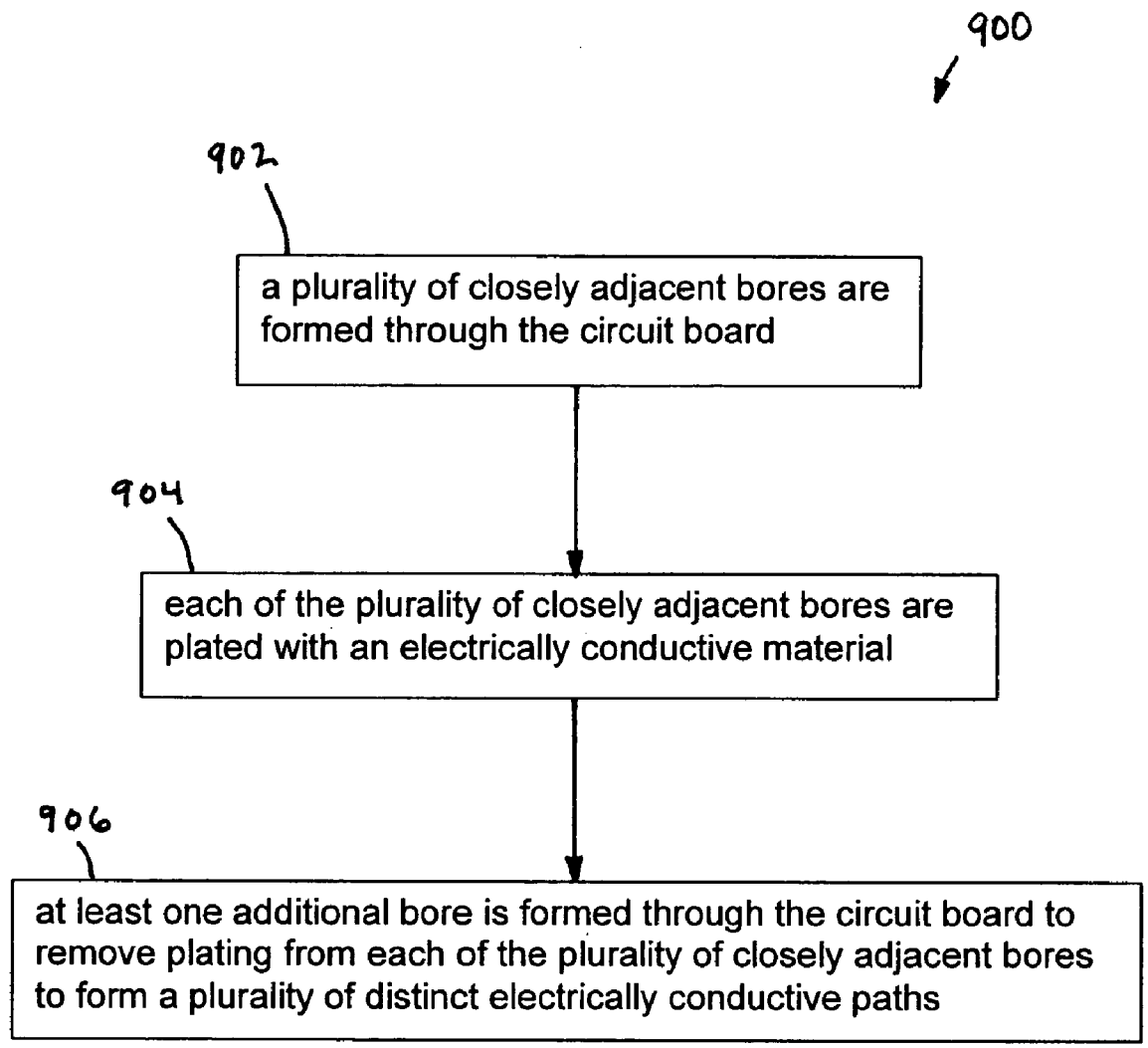

FIG. 9 illustrates a flowchart providing example steps for forming a plurality of electrically conductive paths between conductors on different layers of a circuit board using closely adjacent bores, according to an embodiment of the present invention.

Figure 10:
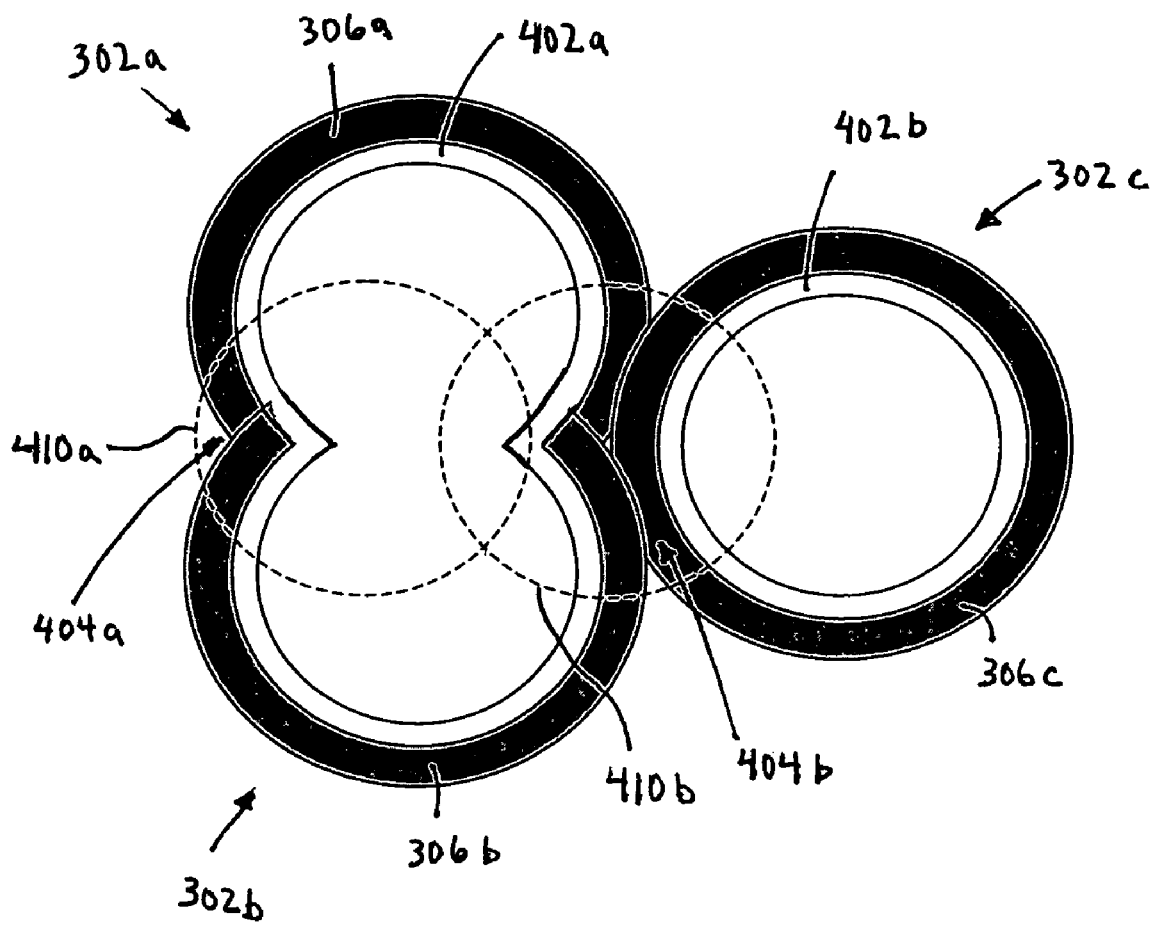

FIG. 10 illustrates a configuration for forming a via having a plurality of electrically conductive paths using a combination of closely adjacent and partially overlapping bores, according to an embodiment of the present invention.

The present invention will now be described with reference to the accompanying drawings. In the drawings alike reference numbers indicate identical or functionally similar elements. Additionally, the last most digits of a reference number identifies the drawing in which the reference number first appears.

DETAILED DESCRIPTION OF THE INVENTION

Overview

The present invention is directed to a via that provides a plurality of electrical connections between conductors on different layers of a circuit board. Multiple distinct electrical paths are formed in an electrically conductive plating on an inner surface of the via to allow for the plurality of distinct electrical connections. An overview of conventional vias is provided below. Via embodiments of the present invention are then described in detail.

Conventional Vias

A typical circuit board is a composite of organic and inorganic materials with external and internal electrical connections. The circuit board allows one or more electronic components attached thereto to be mechanically supported and electrically connected among themselves.

Design and manufacturing techniques for circuit boards have progressed from one or two layered structures to multi-layer boards, where ten or more layers are not uncommon. Multi-layered circuit boards are formed from alternating layers of electrically conductive materials and electrically insulating materials. For example, the electrically insulating or dielectric materials may be organic, plastic, ceramic, and tape material, among other material. Such substrates may include materials such as polyimide, "BT", which includes a resin called bis-maleimide triazine, "FR-4," which is a fire-retardant epoxy resin-glass cloth laminate material, "FR-5," and/or other similar materials.

A via is an electrically conductive opening through one or more dielectric layers of the circuit board, through which an electrical signal may pass. Conventionally, the via passes a single electrical signal between different conductive layers of a circuit board. An inner surface of the opening is typically made conductive to conduct the electrical signal. The opening is typically coated or plated with an electrically conductive material to conduct the signal between different electrical conductive layers of the circuit board. The plating material applied to an inner surface of the via opening may be electrically, chemically, or otherwise deposited on the inner surface. Suitable plating materials include copper, nickel, tin, aluminum, gold, silver, other metals, or combinations/alloys thereof, for example.

"Through" vias and "blind" vias exist. "Through" vias extend through all layers of a circuit board. Blind vias extend through a portion of the layers of the circuit board, including extending between an external surface and an internal conductive layer, or between two internal conductive layers of the circuit board.

Figure 1:
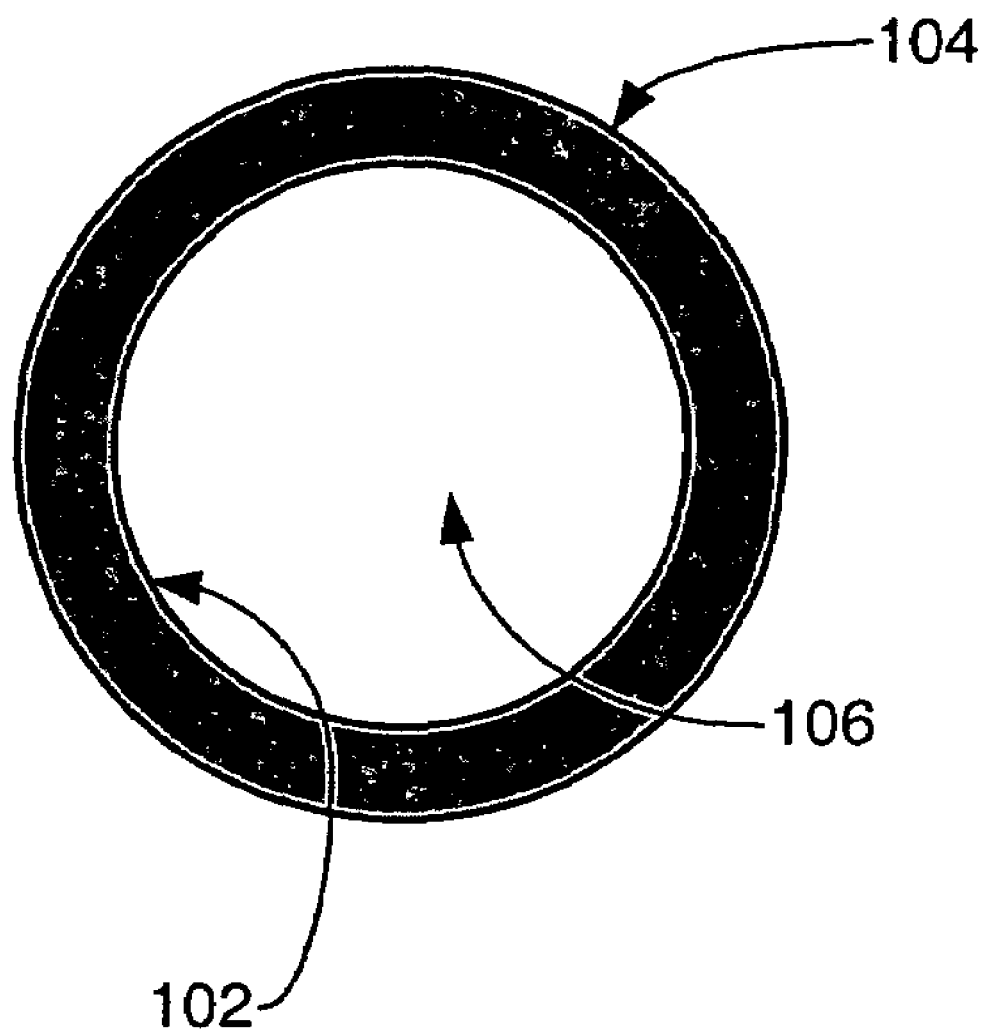
FIG. 1 shows a top view of a conventional via.

FIG. 1 shows a top view of a conventional via 100. Via 100 has a plated inner surface 102, a via pad 104, and an opening 106. Via pad 104 is formed on a surface of the circuit board around via 100, and is electrically coupled to via 100. Via 100 occupies a large area of a circuit board layer, particularly when a corresponding via pad is present. For example, via 100 may have a diameter of 200 microns, and corresponding via pad 104 may have a diameter of 350 microns. Furthermore, a minimum distance must be maintained between any two vias 100 to avoid short circuits. Hence, signal routing flexibility may be adversely limited by the reduced area due to these limitations. The size of the circuit board may be increased to provide more area. However, this tends to cause higher costs and bulkier products. Micro-vias, which are vias that are smaller in size than regular vias, may also be used to conserve circuit board area. Micro-vias, however, are more expensive to form, and for some high density chip applications, do not fully solve the space limitation problem.

Via Embodiments of the Present Invention

As described above, a via of the present invention allows for multiple electrical connections between layers of a circuit board, as opposed to a conventional via, which provides only a single electrical connection. The via of the present invention includes an opening through the circuit board. The opening is formed by a plurality of substantially partially overlapping bores. An electrically conductive plating is formed on an inner surface of the opening. The plurality of distinct electrically conductive paths are formed by one or more additional bores formed in the circuit board. The additional bores remove plating from intersecting portions of the substantially partially overlapping bores.

Note that as used herein, the term "substantially partially overlapping bores" refers to multiple types of bores. "Substantially partially overlapping bores" includes bores that (i) partially overlap each other, (ii) bores that are closely adjacent to each other, and (iii) combinations of partially overlapping and closely adjacent bores. Bores that are closely adjacent to each other include those that have openings that are close to each other, but are not overlapping. For example, in an embodiment, closely adjacent bores include bores that are formed more closely together than is normally practiced and/or allowable using typical via design techniques. In another embodiment, closely adjacent bores may include, but are not limited to, those bores formed so closely adjacent that their respective via pads and/or inner surface platings overlap or come into contact to form a "short circuit." Thus, closely adjacent bores may include bores formed so closely adjacent such that conventional plating processes would tend to connect the bores with plating to cause the closely adjacent bores to become electrically coupled. Examples of some of partially overlapping and closely adjacent of bores are further described below. Furthermore, the vias of the present invention may be either "through" vias or "blind" vias, and may include bores formed according to standard and/or micro-via processes.

The present invention is applicable to all types of circuit boards, including build-up boards, printed circuit boards (PCBs), and integrated circuit (IC) package substrates, for example.

Figure 2:
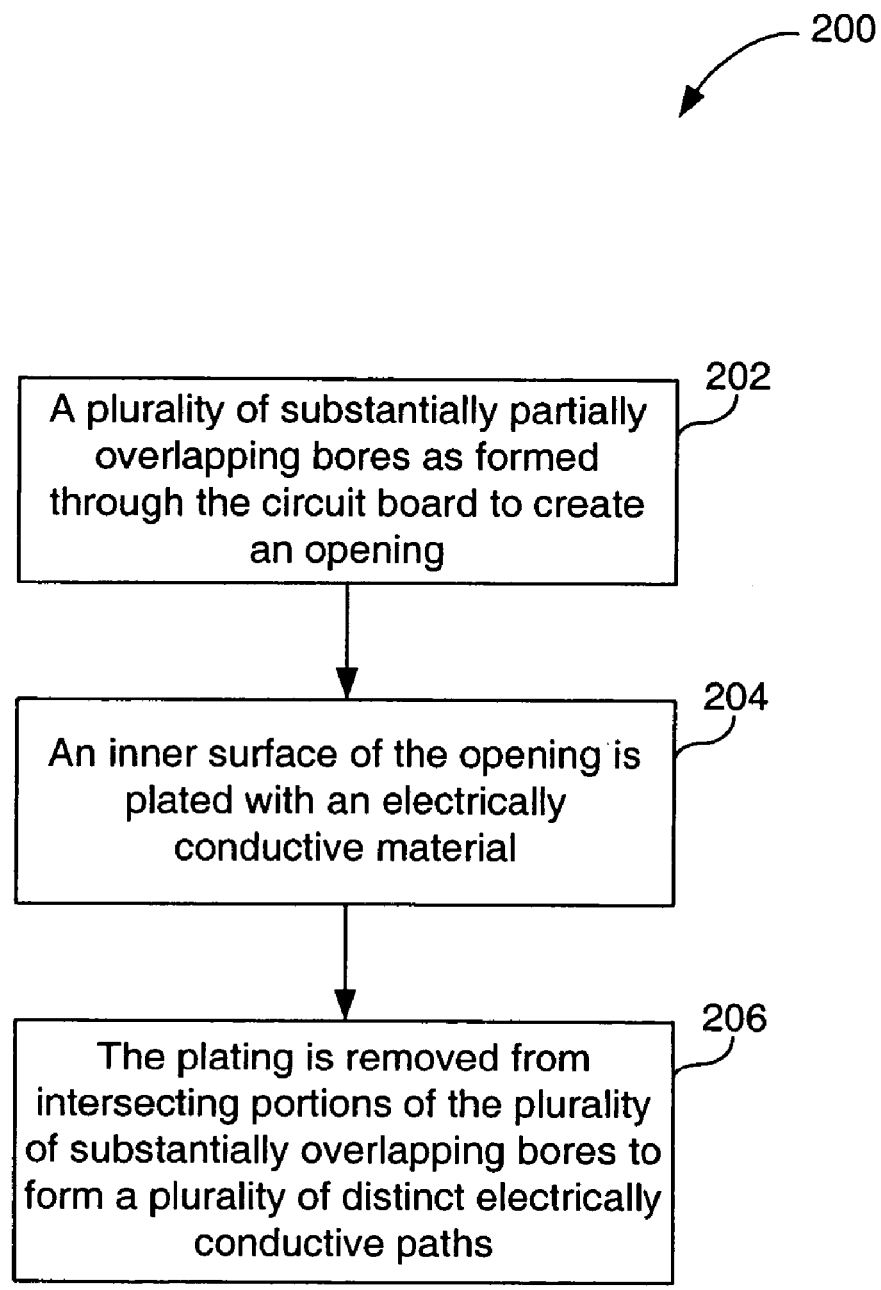
FIG. 2 illustrates a flowchart providing example steps for forming a plurality of electrically conductive paths between conductors on different layers of a circuit board, according to an embodiment of the present invention.

FIG. 2 shows a flowchart 200 providing steps for forming a via of the present invention, according to one or more embodiments of the present invention. As described above, the via of the present invention provides multiple electrically conductive paths between conductors on different layers of a circuit board. Other operational and structural embodiments will be apparent to persons skilled in the relevant art(s) based on the following discussion. The steps of flowchart 200 are described in detail below.

Flowchart 200 begins with step 202. In step 202, a plurality of substantially partially overlapping bores are formed through the circuit board to create an opening. The plurality of substantially partially overlapping bores includes bores that partially overlap and/or bores that are closely adjacent.

In step 204, an inner surface of the opening is plated with an electrically conductive material. The opening may be plated according to any via plating process known to persons skilled in the relevant art(s). Furthermore, the electrically conductive material used to plate the opening may be any such appropriate material, including a metal such as copper, aluminum, tin, nickel, gold, silver, solder, other metal, or a combination/alloy, or other material known by persons skilled in the relevant art(s). Note that step 204 may include a single plating step or multiple plating steps for plating the inner surface. For example, in a two-step plating process, a first plating using an electroless plating process may be used, followed by a second plating using an electrolytic plating process. Other combinations of plating processes may also be used.

In step 206, the plating is removed from intersecting portions of the plurality of substantially overlapping bores, to form a plurality of distinct electrically conductive paths. The plating may be removed in a variety of ways, including by laser etching, mechanical etching, chemical etching, photolithography, and other ways. In an embodiment, step 206 includes a step where at least one additional bore is formed through the circuit board to remove the plating. The additional bore(s) removes plating from the intersecting portions of the plurality of substantially partially overlapping bores.

Figure 3A:
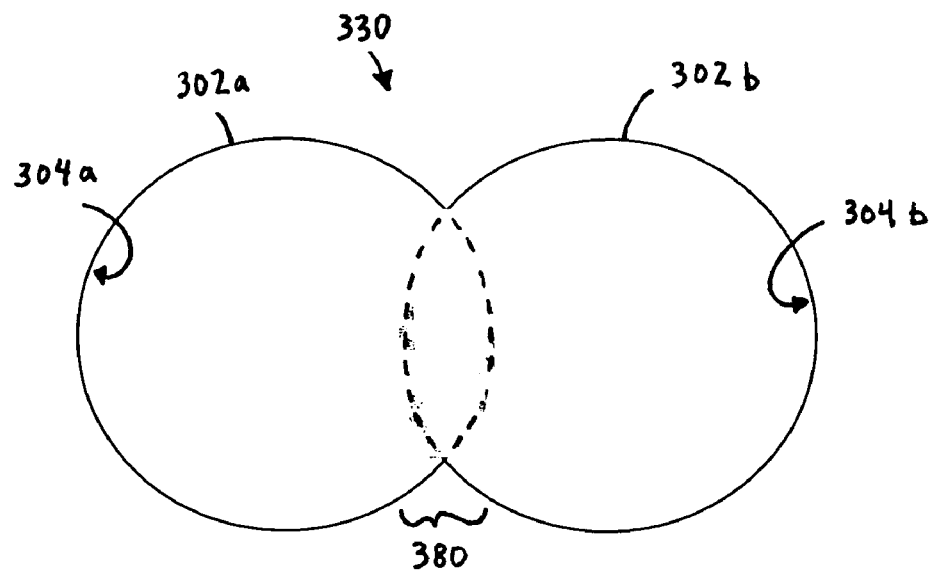
FIG. 3A shows a top view of a pair of partially overlapping bores, according to an example embodiment of the present invention.

As stated above, the plurality of substantially partially overlapping bores formed in step 202 includes bores that partially overlap and/or bores that are closely adjacent. Examples of these types of bores are provided as follows. For example, FIG. 3A shows a first bore 302*a* and a second bore 302*b* that are partially overlapping. An overlapping portion is indicated in FIG. 3A as intersecting portion 380. First and second bores 302*a* and 302*b* each have a respective inner surfaces 304*a* and 304*b*. The combination of inner surfaces 304*a* and 304*b* create an inner surface for the opening through the circuit board formed by first and second bores 302*a* and 302*b*.

Figure 3B:
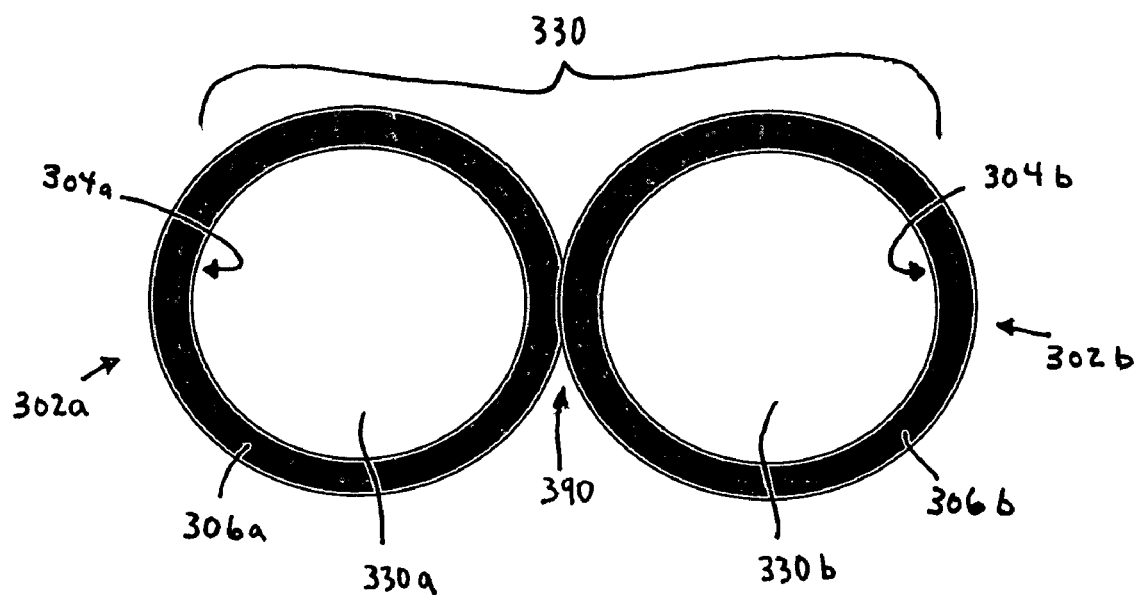
FIGS. 3B and 3C show top views of pairs of closely adjacent bores, according to example embodiments of the present invention.

FIG. 3B shows an example of first bore 302*a* and second bore 302*b* that are not overlapping, and are instead closely adjacent. As shown in FIG. 3B, first and second bores 302*a* and 302*b* have corresponding via pads 306*a* and 306*b*. As shown in FIG. 3B, corresponding via pads 306*a* and 306*b* are in contact, forming a "short circuit" or electrical connection. An intersecting portion of via pads 306*a* and 306*b* is indicated in FIG. 3B as intersecting portion 390.

Figure 3C:
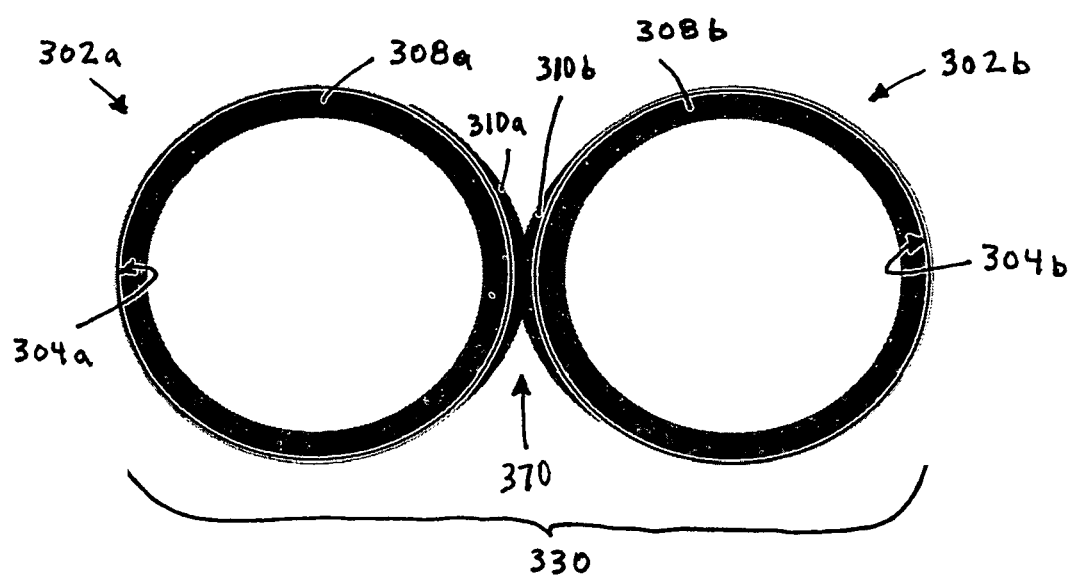

FIG. 3C shows another example-of first and second bores 302*a* and 302*b* that are closely adjacent. As shown in FIG. 3C, inner surfaces 304*a* and 304*b* of first and second bores 302*a* and 302*b* are plated with a first plating 308*a* and a second plating 308*b*, respectively. First and second bores 302*a* and 302*b* may be considered closely adjacent when they are close enough such that an excess plating material 310*a* and/or 310*b* extends sufficiently out of bores 302*a* and 302*b* onto the surface of the circuit board to come into contact to form a "short circuit" or electrical connection. Such contact between platings may be caused by the intentional application of excess plating material, or may occur due to inaccuracies inherent in the particular plating process used. The intersecting portion of plating material 310*a* and/or 310*b* is indicated in FIG. 3C as intersecting portion 370. Thus, as shown in FIGS. 3B and 3C, bores may be considered closely adjacent when their respective die pads and/or excess plating material come into contact.

Note that partially overlapping and/or closely adjacent bores 302 may or may not have corresponding via pads. Hence, step 206 of flowchart 200 may include the step where via pads are formed for one or more of the bores as a portion of the plating. Via pads are typically formed on a surface of a circuit board to provide electrical access to the corresponding via by conductive traces, etc. Via pads are typically formed of a metal such as copper, aluminum, tin, nickel, gold, silver, lead, solder, other metal, or a combination/alloy, or other applicable material known by persons skilled in the relevant art(s). For example, via pads may be formed by an electrolytic plating process used to plate the inner surface of bores 302 in step 206, by another plating process, and/or during another process step.

Note that the bores formed in step 202 and the additional bores formed in step 206 may be formed through the circuit board in a number of ways, including by drilling, laser etching, mechanical etching, chemical etching, photolithography, punching, and other ways of forming the bores. Furthermore, note that the bores may be formed to be round or elliptical, or other shape, such as rectangular, irregular, or other polygon.

Figure 3D:
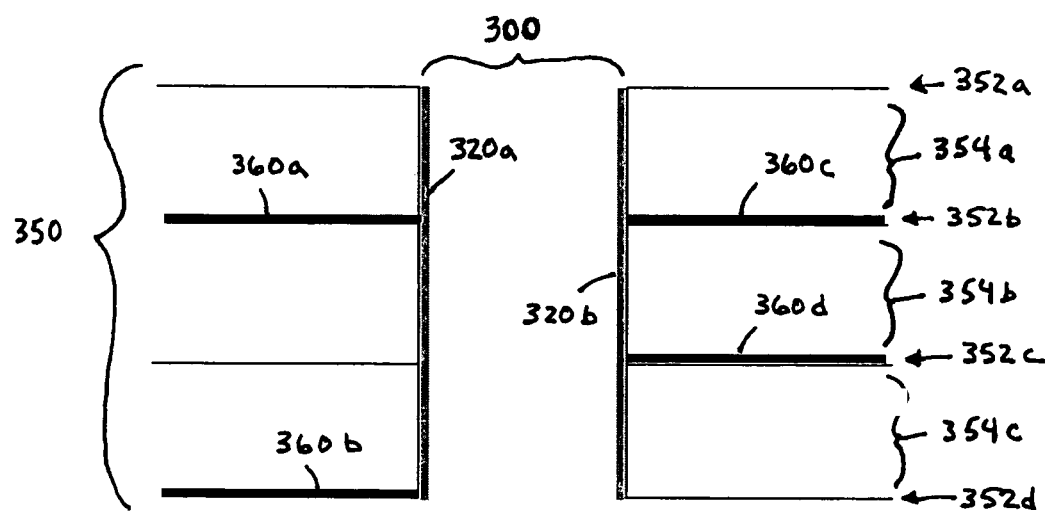
FIG. 3D shows a cross-sectional view of a via of the present invention that provides electrically conductive paths between layers of a circuit board.

As described above, a plurality of distinct electrically conductive paths are created in the via of the present invention. Furthermore, the electrical paths may be formed between conductors of any two or more layers of the circuit board. For example, FIG. 3D shows a cross-sectional view of a via 300 formed in a circuit board 350, according to an example embodiment of the present invention. Via 300 has multiple example conductive paths 320 created therein according to the present invention. As shown in the example of FIG. 3D, a first electrically conductive path 320*a* and a second electrically conductive path 320*b* are present in via 300. Circuit board 350 may have two or more layers 352 in which conductors 360 may be present, that are separated by dielectric or electrically insulating layers 354. In the example of FIG. 3D, circuit board 350 has a first conductive layer 352*a*, a second conductive layer 352*b*, a third conductive layer 352*c*, and a fourth conductive layer 352*d*. First, second, third, and fourth conductive layers 352*a-d* are separated by dielectric or electrically insulating layers 354*a-c*.

As shown in FIG. 3D, first electrically conductive path 320*a* electrically couples a conductor 360*a* in second conductive layer 352*b* to a conductor 360*b* in fourth conductive layer 352*d*. Second electrically conductive path 320*b* electrically couples a conductor 360*c* in second conductive layer 352*b* to a conductor 360*d* in third conductive layer 352*c*. Note that although FIG. 3D shows pairs of conductors 360 that are electrically coupled by conductive paths 320, additional conductors may also coupled together, including three conductors, and greater numbers of conductors, by electrically conductive paths of the present invention.

Furthermore, flowchart 200 may include the step where additional electrically conductive material(s) may be plated or coated on the resulting electrically conductive paths of the via of the present invention. The additional materials may be used to thicken the conductive surfaces, or for other reasons.

Furthermore, flowchart 200 may include the step where the opening may be filled with a material or left unfilled. For example, the opening may be filled with an electrically conductive or non-conductive material. The opening may be filled prior to step 206, or after step 206. If the opening is filled prior to step 206, then the formation of an additional bore can be used to separate the electrically conductive, dielectric, or other material filling the opening into separate portions by removing a portion of the material. Hence, if the material is electrically conductive, the additional bore separates the material into electrically isolated portions. An electrically non-conductive material, such as a solder resist or solder mask material may alternatively be used, for example. After the opening is filled, the top and/or bottom surface of the filled opening may be plated (e.g., a "via-in-pad" as may be referred to in the art). For example, by filling the opening, and plating a surface of the opening, a solder ball or other object may be better attached to the resulting via. The plating formed on the top and/or bottom surface of the opening may be separated by the additional bore(s) or by another process, such as an etching process.

Hence, the present invention creates multiple electrically conductive paths through a via in an area of a circuit board that is smaller than if multiple independent conventional vias are used. Thus, the present invention saves circuit board area. Furthermore, because board space is conserved, fewer circuit board layers may be needed because signal routing is easier. The present invention also saves manufacturing costs by using existing manufacturing equipment to create the multi-electrical path via of the present invention. Furthermore, the area and size of each electrically conductive path, and the space between electrically conductive paths of the vias of the present invention may be controlled. Thus, impedances and electrical signal performances can be improved.

The steps of flowchart 200 are described in further detail in the following subsections in reference to example embodiments of the present invention. These example embodiments are provided for illustrative purposes, and are not intended to limit the invention. In fact, after reading the following description, further via embodiments and processes for forming the vias of the present invention will become apparent to persons skilled in the relevant art(s). Furthermore, note that the embodiments presented herein may be combined in any manner.

Partially Overlapping Bore Embodiments

Via embodiments using partially overlapping bores are described in this section. For illustrative purposes, the present invention is described in terms of two, three, and four partially overlapping bores. However, it is to be understood that any number of two or more partially overlapping bores may be used to form a via of the present invention, including numbers of bores greater than four.

As described above, FIG. 3A shows a top view of partially overlapping first and second bores 302a and 302b formed in a circuit board. First and second bores 302a and 302b create an opening 330, according to step 202 shown in FIG. 2. Together, inner surfaces 304a and 304b form an inner surface of opening 330, indicated as inner surface 450 in FIG. 4A. Note that first and second bores 302a and 302b may have the same diameter, or different diameters. Furthermore, first and second bores 302a and 302b may be formed through any number of layers of the circuit board, one layer at a time, or through multiple layers at a time. First and second bores 302a and 302b may be formed through all of the same layers, or may have one or more different layers as long as there is at least one layer in common.

Figure 4A:
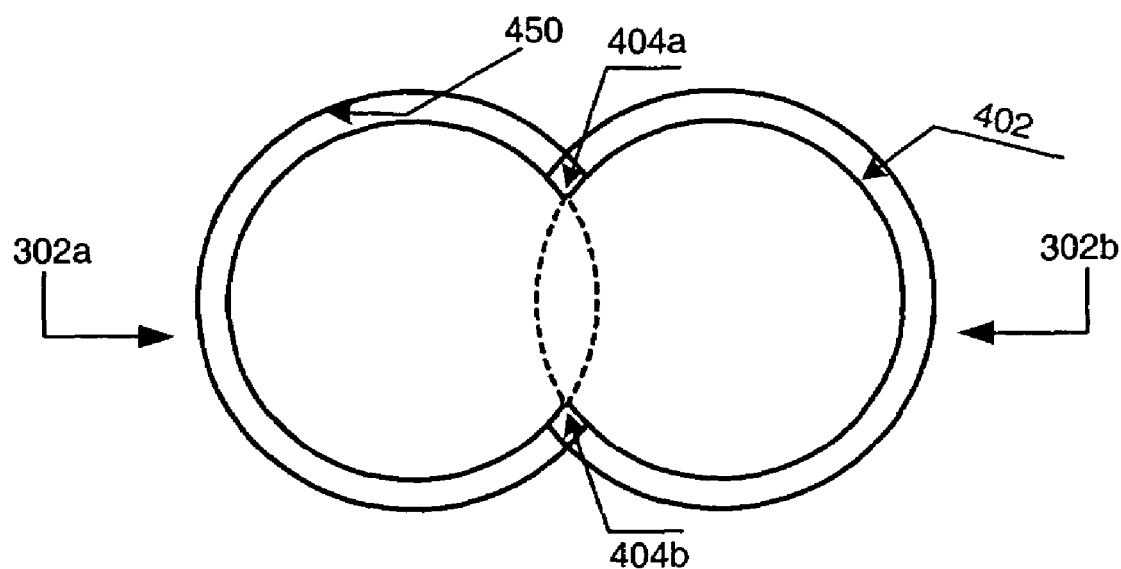
FIGS. 4A-4D show views of example process steps for forming a via having two electrically conductive paths, according to an example embodiment of the present invention.

In step 204 described above, and shown in FIG. 2, an inner surface of the opening is plated with an electrically conductive material. FIG. 4A shows a top view of opening 330 after a plating 402 has been formed on inner surface 450 of opening 330. A first intersecting plating portion 404a and a second intersecting plating portion 404b of plating 402 are shown in FIG. 4A. First and second intersecting plating portions 404a and 404b are portions of plating 402 that are present at intersecting portions of first and second bores 302a and 302b.

Figure 4B:
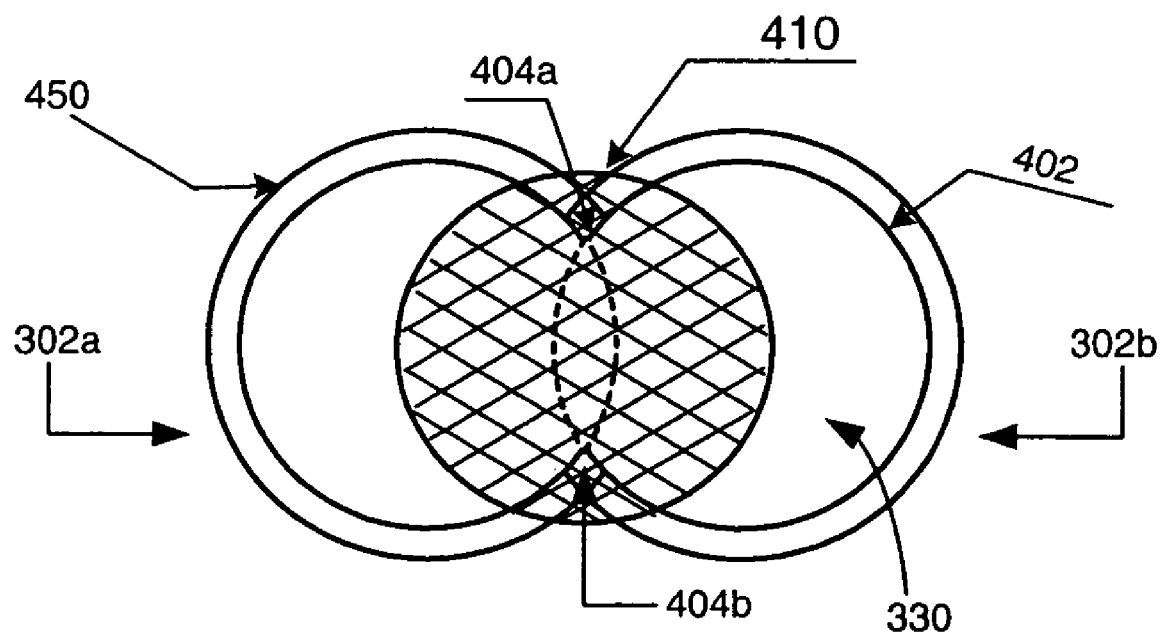

FIG. 4B shows a top view of opening 330, with an outline of an additional bore 410 that can be formed in the circuit board. As shown in FIG. 4B, the outline of additional bore 410 overlaps first and second intersecting portions 404a and 404b.

Figure 4C:
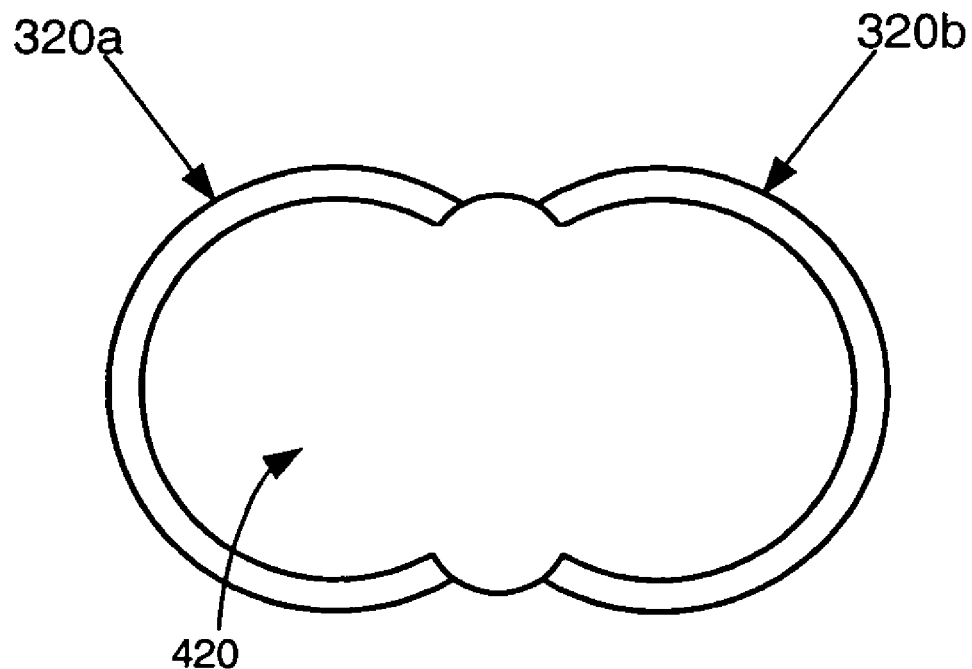
Figure 4D:
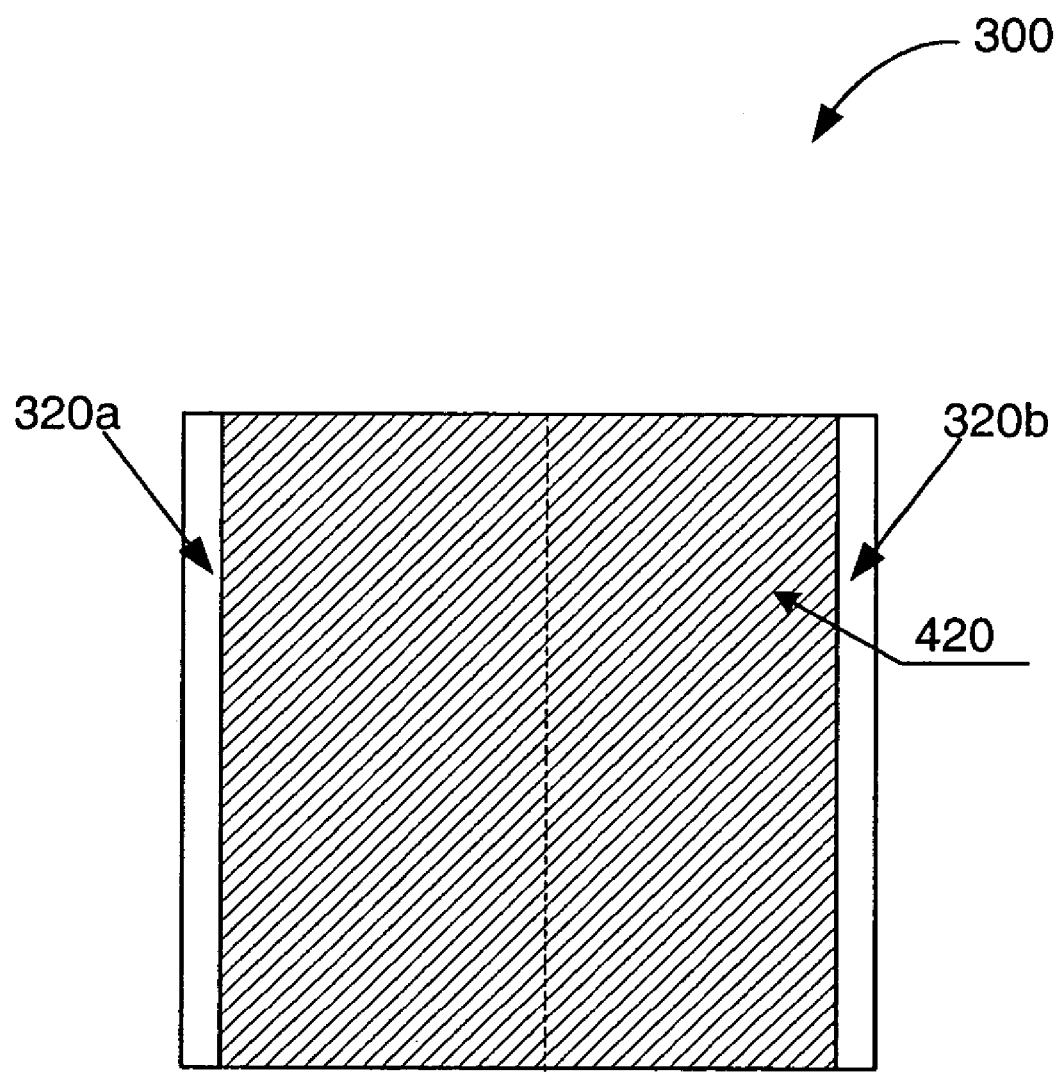

In step 206 described above, and shown in FIG. 2, the plating is removed from intersecting portions of the plurality of substantially overlapping bores, to form a plurality of distinct electrically conductive paths. FIG. 4C shows a top view of a via 300, according to an example embodiment of the present invention. FIG. 4D shows a cross-sectional view of via 300. Via 300 has an opening 420, and distinct first and second electrically conductive paths 320a and 320b between conductive layers of the circuit board. First and second electrically conductive paths 320a and 320b are formed in plating 402 by additional bore 410, which removed portions of plating 402 from intersecting portions of the overlapping bores, including the removal of intersecting portions 404a and 404b. Note that additional bore(s) 410 may or may not remove lesser or additional portion(s) of the circuit board and plating 402 than shown in FIG. 4C. By removing intersecting portions of plating 402, first and second electrically conductive paths 320a and 320b are distinct within via 300.

Opening 420 of via 300 may be filled with a material or left unfilled. For example, opening 420 may be filled with an electrically conductive or non-conductive material. Opening 420 may be filled prior to step 206, or after step 206. If opening 420 of via 300 is filled prior to step 206, then the formation of an additional bore 410 can be used to separate the electrically conductive, dielectric, or other material filling opening 420 into separate portions by removing a portion of the material. Hence, if the material is electrically conductive, additional bore 410 separates the material into electrically isolated portions.

Figure 4E:
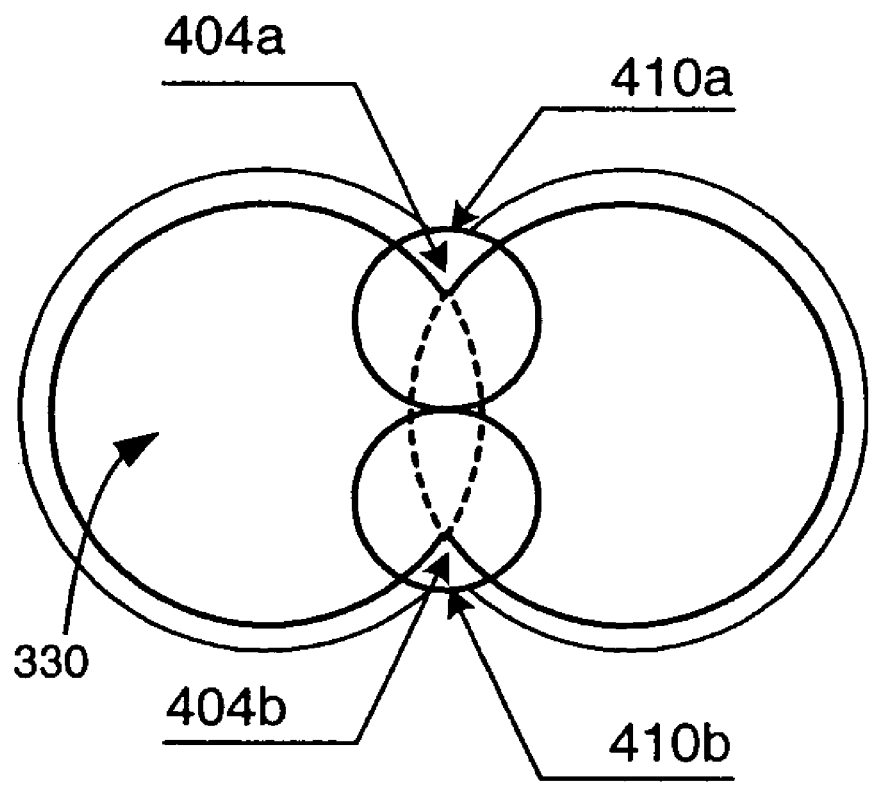
FIG. 4E shows a view of an example process step for forming a via, where a pair of additional bores are used to remove plating, according to an example embodiment of the present invention.

FIG. 4E illustrates an alternative embodiment where multiple additional bores may be used to separate plating 402 shown in FIG. 4A. As shown in FIG. 4E, a first additional bore 410a and a second additional bore 410b may be used to remove intersecting portions 404a and 404b, respectively, instead of a using single additional bore, as shown in FIGS. 4B and 4C.

Figure 5A:
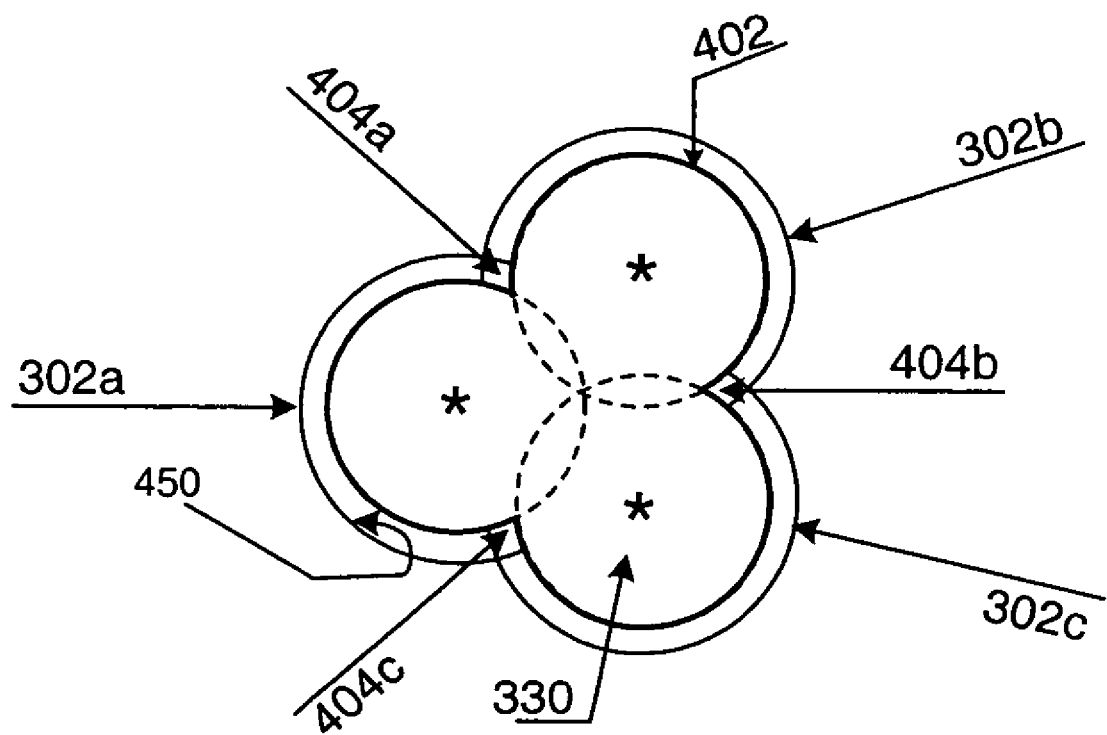
FIGS. 5A-5C show views of example process steps for forming a via having three electrically conductive paths, according to an example embodiment of the present invention.

Note that the present invention is applicable to embodiments where greater than two bores 302 are formed during step 202, as shown in the example of FIG. 4A. Some examples of these embodiments are provided below. For example, FIG. 5A shows a top view of opening 330, formed according to step 202 shown in FIG. 2, having three partially overlapping bores: first bore 302a, second bore 302b, and third bore 302c. First, second, and third bores 302a, 302b, 302c collectively form opening 330 in the circuit board. First bore 302a, second bore 302b, and third bore 302c each have an inner surface that collectively form inner surface 450 of opening 330. As shown in FIG. 5A, inner surface 450 has been plated with plating 402, according to step 204 of FIG. 2.

Figure 5B:
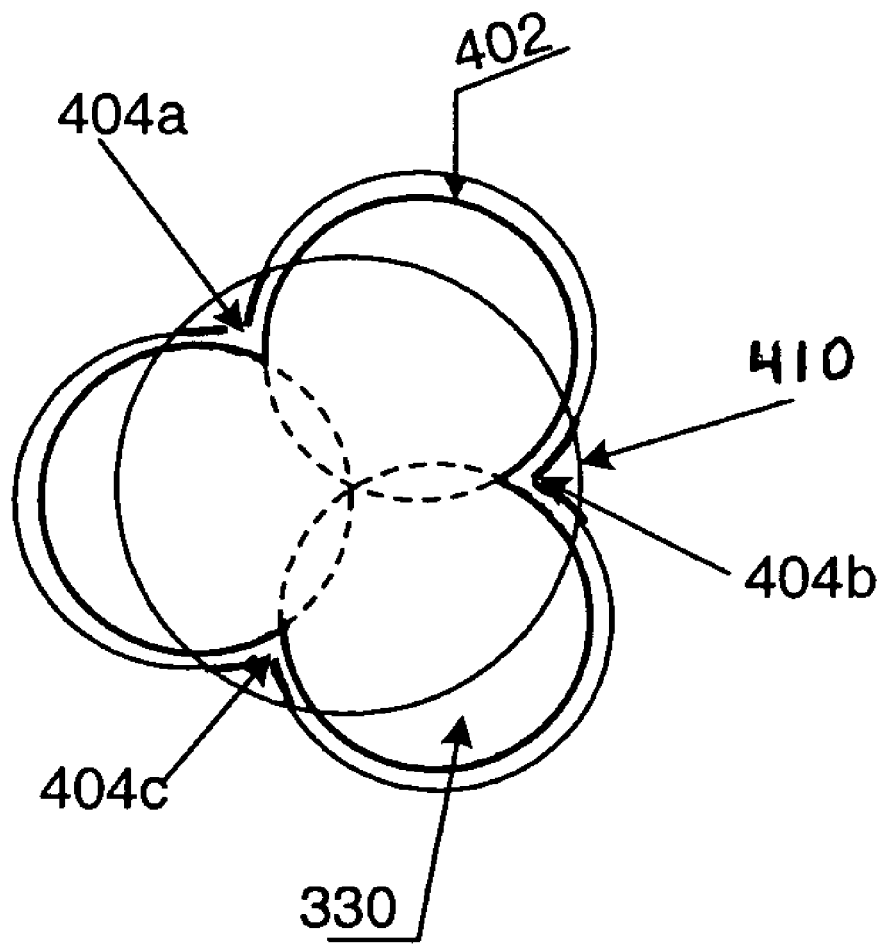
Figure 5C:
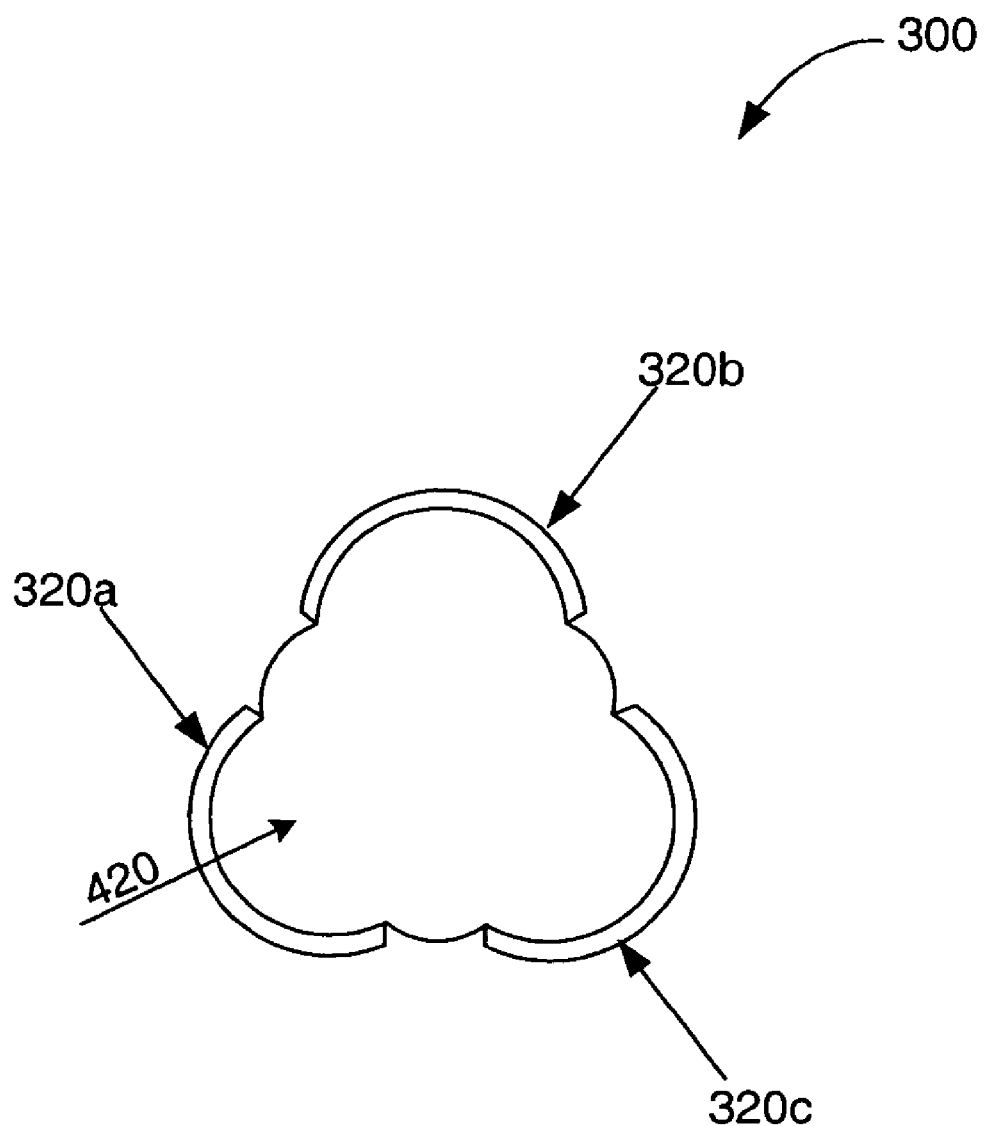

FIG. 5B shows a single additional bore 410 positioned to remove plating from the three bore embodiment shown in FIG. 5A. FIG. 5C shows a top view of a via 300 resulting from application of the single additional bore 410 shown in FIG. 5B, according to an example embodiment of the present invention. FIG. 5C shows plating 402 having been removed from intersecting portions 404a-c of first, second, and third bores 302a, 302b, 302c to form first, second, and third distinct electrically conductive paths 320a, 320b, and 320c, according to step 206 shown in FIG. 2. First, second, and third electrically conductive paths 320a, 320b, 320c are formed in plating 402 by additional bore 410, which removed portions of plating 402, including intersecting portions 404a-c. By removing intersecting portions of plating 402, first, second, and third electrically conductive paths 320a, 320b, 320c are distinct within via 300.

Figure 5D:
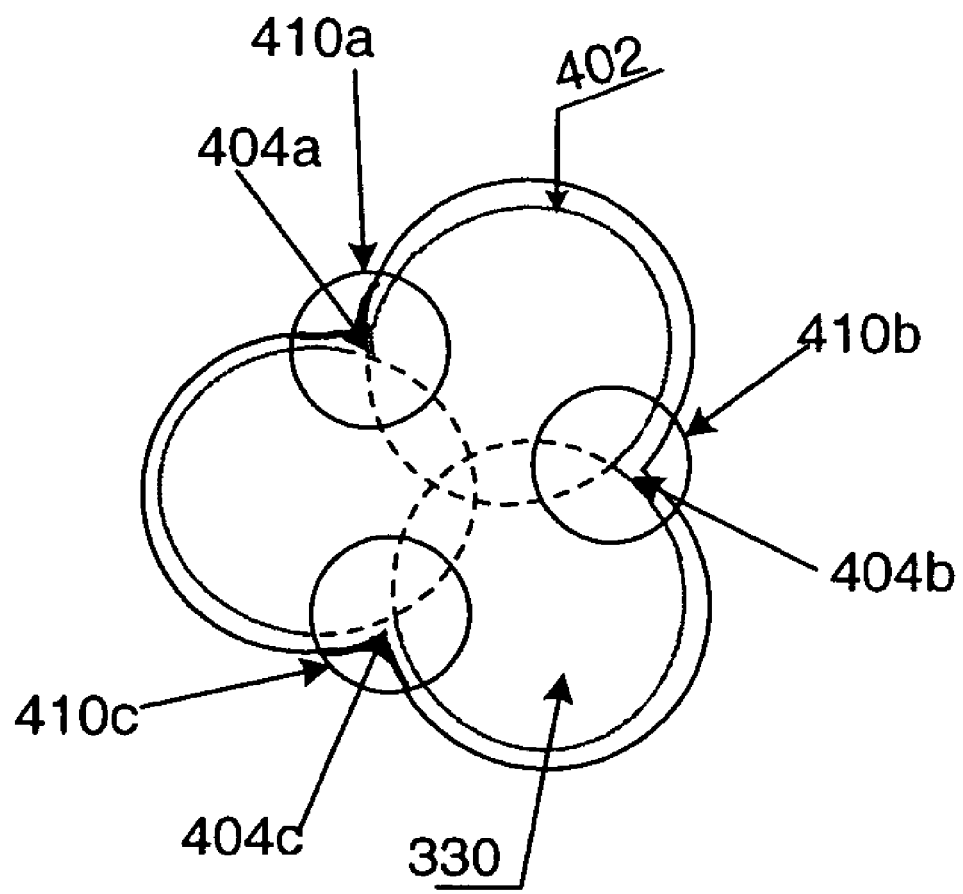
FIG. 5D shows a view of an example process step for forming a via, where three additional bores are used to remove plating, according to an example embodiment of the present invention.

FIG. 5D illustrates an alternative embodiment where multiple additional bores are used to separate plating 402 shown in FIG. 5A. For example, as shown in FIG. 5D, first, second, and third additional bores 410a-c may be used to remove intersecting portions 404a-c, respectively, instead of using a single additional bore, as shown in FIG. 5B. Other numbers of additional bores may also be used in alternative embodiments to remove plating 402.

FIG. 6A shows a top view of opening 330, formed according to step 202 shown in FIG. 2, having four substantially partially overlapping bores: first bore 302a, second bore 302b, third bore 302c, and fourth bore 302d. First, second, third, and fourth bores 302a-d collectively form opening 330 in the circuit board. First, second, third, and fourth bores 302a-d each have an inner surface that collectively form inner surface 450 of opening 330. As shown in FIG. 6A, inner surface 450 has been plated with plating 402, according to step 204 of FIG. 2.

FIG. 6B shows a single additional bore 410 positioned to remove plating from the four bore embodiment shown in FIG. 6A. FIG. 6E shows a top view of a via 300 resulting from application of the single additional bore 410 shown in FIG. 6B, according to an example embodiment of the present invention. FIG. 6E shows plating 402 having been removed from intersecting portions 404a-d of first, second, third, and fourth bores 302a-d to form first, second, third, and fourth distinct electrically conductive paths 320a-d, according to step 206 shown in FIG. 2. First, second, third, and fourth electrically conductive paths 320a-d are formed in plating 402 by additional bore 410, which removed portions of plating 402, including intersecting portions 404a-d. By removing intersecting portions of plating 402, first, second, third, and fourth electrically conductive paths 320a-d are distinct within via 300.

Note that alternative combinations of additional bores, and different sized additional bores, may be used to remove plating in embodiments of the present invention. For example, FIG. 6C shows a relatively larger first additional bore 410a positioned to remove plating from intersecting portions 404c and 404d of plating 402. FIG. 6D. Thus, after application of first additional bore 410a in FIG. 6C, plating 402 is separated into two portions, first and second plating portions 602a and 602b. First and second plating portions 602a and 602b may be used as electrically conductive paths in an embodiment, if desired. Furthermore, FIG. 6D shows second and third additional bores 410b and 410c positioned to remove plating from intersecting portions 404a and 404b. Hence, the combination of first, second, and third additional bores 410a-c shown in FIG. 6D may be used to create first, second, third, and fourth electrically conductive paths 320a-d, as shown in FIG. 6E. Alternatively, for example, two or four additional bores (not shown) may be used in step 206 to remove intersecting portions 404a-d of plating 402 shown in FIG. 6A. Other numbers of additional bores may also be used in embodiments to remove plating 402.

FIG. 7 shows an example flowchart 700, similar to flowchart 200 shown in FIG. 2, according to an example embodiment of the present invention. Flowchart 200 is directed to forming a via using partially overlapping bores. Examples of such vias are shown in FIGS. 3A, 4A-4E, 5A-5D, and 6A-6E. Other operational and structural embodiments will be apparent to persons skilled in the relevant art(s) based on the following discussion. The steps of flowchart 700 are described in detail below.

Flowchart 700 begins with step 702. In step 702, a plurality of partially overlapping bores are formed through the circuit board to create an opening. For example, the plurality of closely adjacent bores are closely adjacent bores 302, which create opening 330, as described above with respect to FIGS. 3A, 4A-4E, 5A-5D, and 6A-6E.

In step 704, an inner surface of the opening is plated with an electrically conductive material. For example, inner surface 450 of opening 330 may be plated with a plating 402, as described above with respect to FIGS. 3A, 4A-4E, 5A-5D, and 6A-6E.

In step 706, the plating is removed from intersecting portions of the plurality of overlapping bores to form a plurality of distinct electrically conductive paths. For example, plating 402 may be removed from intersecting portions 404 by one or more additional bores 410 to form distinct electrically conductive paths 320, as described above with respect to FIGS. 3A, 4A-4E, 5A-5D, and 6A-6E.

Adjacent Bore Embodiments

Vias embodiments using closely adjacent bores are described in this section. For illustrative purposes, the present invention is described in terms of a pair of closely adjacent bores. However, it is to be understood that any number of closely adjacent bores may be used to form a via of the present invention, including numbers of closely adjacent bores greater than two. Furthermore, the description below applied to all types of closely adjacent bores, including the examples shown in FIGS. 3B and 3C.

For example, as shown in FIG. 3B, and described above, closely adjacent first and second bores 302a and 302b are formed in a circuit board, according to step 202. First bore 302a has an inner surface 304a, an opening 330a, and a via pad 306a. Second bore 302b has an inner surface 304b, an opening 330b, and a via pad 306b. Via pads 306a and 306b are in electrical contact.

In step 204 described above, and shown in FIG. 2, an inner surface of the opening is plated with an electrically conductive material. Note that openings 330a and 330b shown in FIG. 3B collectively form an opening 330 for the substantially partially overlapping bores 302a and 302b shown in FIG. 3B. FIG. 8A shows first and second bores 302a and 302b with platings 402a and 402b formed therein, respectively, according to step 204. First and second bores 302a and 302b may be plated simultaneously or sequentially. FIG. 8A also shows a single additional bore 410 positioned to remove portions of plating of first and second bores 302a and 302b. In a closely adjacent bore embodiment as shown in FIG. 8A, where via pads 306a and 306b are in contact, the plating to be removed in step 206 includes contacting portion of via pads 306a and 306b, which is shown as overlapping portion 390.

FIG. 8B shows a top view of a via 300 resulting from application of the single additional bore 410 shown in FIG. 8A, according to an example embodiment of the present invention. FIG. 8B shows intersecting portion 390 has been removed to form first and second distinct electrically conductive paths 320a and 320b, according to step 206 shown in FIG. 2. By removing intersecting portion 390, first and second electrically conductive paths 320a and 320b are distinct within via 300.

FIG. 8C illustrates an alternative embodiment of the present invention for step 206, where multiple additional bores may be used to separate plating 402 shown in FIG. 8A. For example, as shown in FIG. 8C, first and second additional bores 410a and 410b may be used to remove intersecting portion 390 instead of using a single additional bore, as shown in FIG. 8A. Other numbers of additional bores may also be used in alternative embodiments to remove intersecting portion 390.

FIG. 9 shows an example flowchart 900, similar to flowchart 200 shown in FIG. 2, according to an example embodiment of the present invention. Flowchart 900 is directed towards forming a via using closely adjacent bores, such as is shown in FIGS. 3B and 8A-8C. Other operational and structural embodiments will be apparent to persons skilled in the relevant art(s) based on the following discussion. The steps of flowchart 900 are described in detail below.

Flowchart 900 begins with step 902. In step 902, a plurality of closely adjacent bores are formed through the circuit board. For example, in a two bore embodiment, the plurality of closely adjacent bores are closely adjacent bores 302a and 302b, which collectively form opening 330, as shown in FIGS. 3B and 3C, and described above.

In step 904, each of the plurality of closely adjacent bores are plated with an electrically conductive material. For example, bores 302a and 302b shown in FIGS. 3B and 3C may be plated with platings 402a and 402b, respectively, as shown in FIG. 8A and described above.

In step 906, at least one additional bore is formed through the circuit board to remove plating from each of the plurality of closely adjacent bores to form a plurality of distinct electrically conductive paths. For example, as shown in FIG. 8B, portions of at least via pads 306a and 306b have been removed from each of bores 302a and 302b by one or more additional bores 410 to form distinct electrically conductive paths 320a and 320b, as described above.

Via Embodiments Combining Partially Overlapping and Closely Adjacent Bores

Note that the embodiments described herein may be combined in any manner. For example, FIG. 10 shows an embodiment of the present invention where partially overlapping and closely adjacent bores 302 are formed in the circuit board, according to step 202 shown in FIG. 2. As shown in FIG. 10, first, second, and third bores 302a-c are formed in a circuit board, each having a respective via pad 306a-c. First and second bores 302a and 302b are partially overlapping bores. Third bore 302c is closely adjacent to first and second bores 302a and 302b. First and second bores 302a and 302b have a plating 402a formed on their inner surface, and third bore 302c has a plating 402b formed on its inner surface.

FIG. 10 further shows example first and second additional bores 410a and 410b that may be applied during step 206 to removing intersecting portions of bores 302a-c. For example, first additional bore 410a removes intersecting portion 404a, which includes portions of plating 402a and via pads 302a and 302b. Second additional bore 410b removes a portion of plating 402 and contacting portions of via pads 306a-c (indicated generally as intersecting portion 404b). Hence, three distinct electrically conductive paths may be formed by the configuration shown in FIG. 10. Note that other numbers of additional bores 410 may alternatively be used to remove plating.

The embodiment shown in FIG. 10 is presented herein for illustrative purposes. Any number of combinations of partially overlapping and closely adjacent bores within the scope and spirit of the present invention will be apparent to persons skilled in the relevant art(s) from the teachings herein.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A via in a circuit board formed by a process comprising:
    forming partially overlapping bores to provide an opening; and
    forming electrically conductive paths that are electrically isolated from each other in the opening;
    wherein forming the partially overlapping bores includes forming N partially overlapping bores, wherein forming the electrically conductive paths includes forming N electrically conductive paths that are electrically isolated from each other in the opening, and wherein N is an integer that is greater than one.

2. A via in a circuit board formed by a process comprising:
    forming partially overlapping bores to provide an opening; and
    forming electrically conductive paths that are electrically isolated from each other in the opening;
    wherein forming the partially overlapping bores includes forming M partially overlapping bores, wherein forming the electrically conductive paths includes forming N electrically conductive paths that are electrically isolated from each other in the opening, and wherein N<M.

3. A method of forming a via in a circuit board, comprising:
    forming partially overlapping bores to provide an opening; and
    forming electrically conductive paths that are electrically isolated from each other in the opening;
    wherein forming the partially overlapping bores includes forming N partially overlapping bores, wherein forming the electrically conductive paths includes forming N electrically conductive paths that are electrically isolated from each other in the opening, and wherein N is an integer that is greater than one.

4. A method of forming a via in a circuit board, comprising:
    forming partially overlapping bores to provide an opening; and
    forming electrically conductive paths that are electrically isolated from each other in the opening;
    wherein forming the partially overlapping bores includes forming M partially overlapping bores, wherein forming the electrically conductive paths includes forming N electrically conductive paths that are electrically isolated from each other in the opening, and wherein N<M.

5. A via in a circuit board formed by a process comprising:
    forming closely adjacent bores; and connecting the closely adjacent bores to provide an opening, including forming electrically conductive paths that are electrically isolated from each other in the opening;

wherein forming the closely adjacent bores includes forming N closely adjacent bores, wherein forming the electrically conductive paths includes forming N electrically conductive paths that are electrically isolated from each other in the opening, and wherein N is an integer that is greater than one.

6. A via in a circuit board formed by a process comprising:

forming closely adjacent bores; and connecting the closely adjacent bores to provide an opening, including forming electrically conductive paths that are electrically isolated from each other in the opening;

wherein forming the closely adjacent bores includes forming M closely adjacent bores, wherein forming the electrically conductive paths includes forming N electrically conductive paths that are electrically isolated from each other in the opening, and wherein N<M.

7. A method of forming a via in a circuit board, comprising:

forming closely adjacent bores; and connecting the closely adjacent bores to provide an opening, including forming electrically conductive paths that are electrically isolated from each other in the opening;

wherein forming the closely adjacent bores includes forming N closely adjacent bores, wherein forming the electrically conductive paths includes forming N electrically conductive paths that are electrically isolated from each other in the opening, and wherein N is an integer that is greater than one.

8. A method of forming a via in a circuit board, comprising:

forming closely adjacent bores; and connecting the closely adjacent bores to provide an opening, including forming electrically conductive paths that are electrically isolated from each other in the opening;

wherein forming the closely adjacent bores includes forming M closely adjacent bores, wherein forming the electrically conductive paths includes forming N electrically conductive paths that are electrically isolated from each other in the opening, and wherein N<M.

* * * * *